United States Patent
Iwazaki et al.

(10) Patent No.: US 9,666,785 B2
(45) Date of Patent: May 30, 2017

(54) PIEZOELECTRIC DRIVING DEVICE, ROBOT, AND DRIVING METHOD OF THE SAME

(71) Applicant: Seiko Epson Corporation, Tokyo (JP)

(72) Inventors: Tomohisa Iwazaki, Matsumoto (JP); Akio Konishi, Matsumoto (JP); Kiichi Kajino, Matsumoto (JP); Koichi Kamijo, Matsumoto (JP); Osamu Miyazawa, Shimosuwa (JP); Yutaka Arakawa, Hara (JP); Daisuke Yamada, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/823,264

(22) Filed: Aug. 11, 2015

(65) Prior Publication Data

US 2016/0049574 A1    Feb. 18, 2016

(30) Foreign Application Priority Data

Aug. 13, 2014  (JP) .................................. 2014-164631

(51) Int. Cl.
| | |
|---|---|
| *H02N 2/00* | (2006.01) |
| *H01L 41/047* | (2006.01) |
| *B25J 9/12* | (2006.01) |
| *H01L 41/09* | (2006.01) |
| *H02N 2/10* | (2006.01) |
| *B25J 17/00* | (2006.01) |
| *H01L 41/04* | (2006.01) |

(Continued)

(52) U.S. Cl.
CPC ............ *H01L 41/0475* (2013.01); *B25J 9/12* (2013.01); *B25J 17/00* (2013.01); *H01L 41/042* (2013.01);

(Continued)

(58) Field of Classification Search
CPC ... H01L 41/09; H01L 41/042; H01L 41/0472; H01L 41/0475; H01L 41/0913; H01L 41/0906; H02N 2/004; H02N 2/0085

(Continued)

(56) References Cited

U.S. PATENT DOCUMENTS

| | | |
|---|---|---|
| 6,909,222 B2 | 6/2005 | Sawada |
| 7,224,102 B2 | 5/2007 | Miyazawa |

(Continued)

FOREIGN PATENT DOCUMENTS

| | | |
|---|---|---|
| EP | 0725476 A1 | 8/1996 |
| JP | 08-111991 A | 4/1996 |

(Continued)

OTHER PUBLICATIONS

Extended European Search Report for Application No. EP 15180527.2 dated Jan. 20, 2016 (5 pages).

*Primary Examiner* — Derek Rosenau
(74) *Attorney, Agent, or Firm* — Harness, Dickey & Pierce, P.L.C.

(57) ABSTRACT

A piezoelectric driving device includes a vibrating plate, and a piezoelectric vibrating body including a substrate, and piezoelectric elements provided on the substrate. The piezoelectric element includes a first electrode, a second electrode, and a piezoelectric body, and the first electrode, the piezoelectric body, and the second electrode are laminated in this order on the substrate. The piezoelectric vibrating body is installed on the vibrating plate so that the piezoelectric element is interposed between the substrate and the vibrating plate. A wiring pattern including a first wiring corresponding to the first electrode and a second wiring corresponding to the second electrode is formed on the vibrating plate, the first electrode and the first wiring are connected to each other through a first laminated conducting portion, and the second electrode and the second wiring are connected to each other through a second laminated conducting portion.

20 Claims, 18 Drawing Sheets

(51) Int. Cl.
*H02P 25/02* (2016.01)
*H02P 25/16* (2006.01)

(52) U.S. Cl.
CPC .......... *H01L 41/0472* (2013.01); *H01L 41/09* (2013.01); *H01L 41/0913* (2013.01); *H02N 2/004* (2013.01); *H02N 2/0085* (2013.01); *H02N 2/103* (2013.01); *H02P 25/027* (2013.01); *H02P 25/16* (2013.01); *Y10S 901/28* (2013.01)

(58) Field of Classification Search
USPC ........................................ 310/323.01–323.21
See application file for complete search history.

(56) References Cited

U.S. PATENT DOCUMENTS

| | | | |
|---|---|---|---|
| 8,508,826 B2 | 8/2013 | Terada et al. | |
| 2004/0017131 A1* | 1/2004 | Sawada | G04C 3/12 310/311 |
| 2009/0009109 A1* | 1/2009 | Hashimoto | H02N 2/004 318/116 |
| 2011/0062823 A1 | 3/2011 | Seki et al. | |
| 2012/0248805 A1* | 10/2012 | Kamijo | B25J 15/0009 294/213 |
| 2013/0223192 A1 | 8/2013 | Nishiwaki | |

FOREIGN PATENT DOCUMENTS

| | | |
|---|---|---|
| JP | 09-140169 A | 5/1997 |
| JP | 11-087794 A | 3/1999 |
| JP | 2004-289965 A | 10/2004 |
| JP | 2004-320979 A | 11/2004 |
| JP | 2006-238586 A | 9/2006 |
| JP | 2007-259669 A | 10/2007 |
| JP | 2009-265362 A | 11/2009 |
| JP | 2012-025096 A | 2/2012 |
| JP | 2014-030290 A | 2/2014 |
| WO | WO-03-075446 A1 | 9/2003 |

* cited by examiner

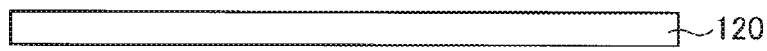
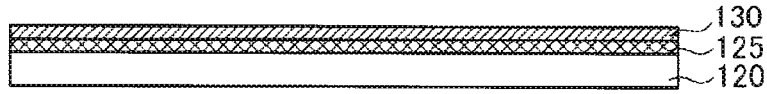
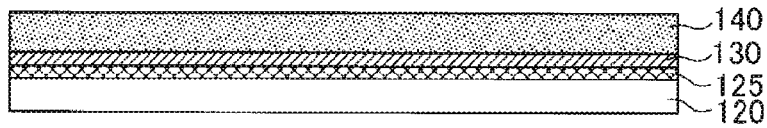
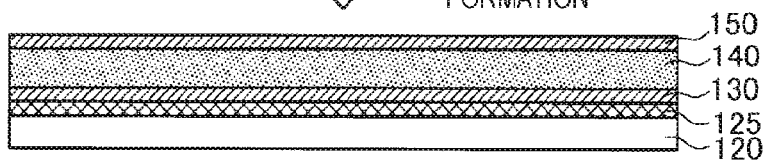
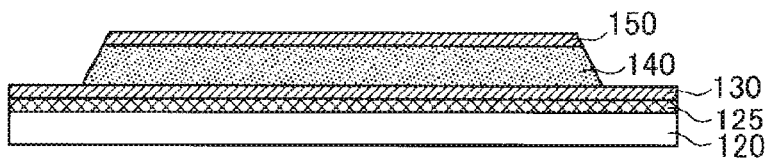
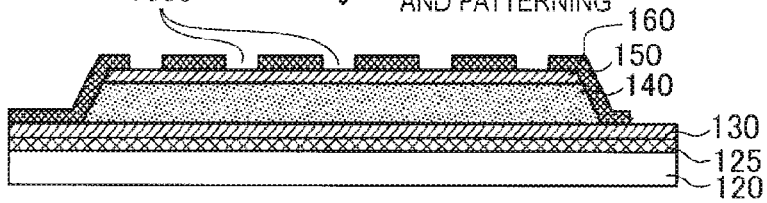
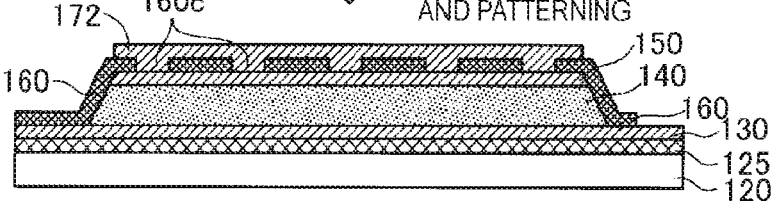

PIEZOELECTRIC DRIVING DEVICE, ROBOT, AND DRIVING METHOD OF THE SAME

BACKGROUND

1. Technical Field

The present invention relates to a piezoelectric driving device, and various apparatuses such as a robot including a piezoelectric driving device.

2. Related Art

In the related art, a piezoelectric actuator (piezoelectric driving device) using a piezoelectric element has been known (for example, see JP-A-2004-320979). A basic configuration of this piezoelectric driving device is a configuration in which four piezoelectric elements are arranged on each of two surfaces of a reinforcing plate to have two rows and two columns, and accordingly, eight piezoelectric elements in total are provided on both sides of the reinforcing plate. Each piezoelectric element is a unit in which a piezoelectric body is interposed between two electrodes and the reinforcing plate is also used as one electrode of the piezoelectric element. A protrusion which comes in contact with a rotor, which is a body to be driven, to rotate the rotor is provided on one end of the reinforcing plate. When the AC voltage is applied to two piezoelectric elements diagonally disposed among the four piezoelectric elements, the two piezoelectric elements perform an expansion and contraction operation, and accordingly, the protrusion of the reinforcing plate performs a reciprocal operation or an elliptic operation. The rotor, which is a body to be driven, rotates in a predetermined rotation direction according to the reciprocal operation or the elliptic operation of the protrusion of the reinforcing plate. In addition, it is possible to rotate the rotor in a reverse direction, by switching the two piezoelectric elements to be targets of application of the AC voltage, with the other two piezoelectric elements.

In the related art, a so-called bulk-like piezoelectric body has been used as a piezoelectric body used in the piezoelectric driving device. In this specification, the "bulk-like piezoelectric body" means a piezoelectric body having a thickness equal to or greater than 100 µm. A reason for using the bulk-like piezoelectric body is because it is desired to increase the thickness of the piezoelectric body, in order to sufficiently increase an amount of force applied to a body to be driven from the piezoelectric driving device.

However, when the piezoelectric driving device is accommodated and used in a small space (for example, in a joint of a robot), wiring space may be insufficient in a case of the piezoelectric driving device using a piezoelectric body of the related art, and accordingly, the thickness of the piezoelectric body is desired to be smaller than 100 µm. However, in the related art, a structure of a piezoelectric driving device suitable for a piezoelectric body having a small thickness has not been sufficiently investigated.

In addition, in the related art, wiring between a driving circuit and the piezoelectric element was constructed by soldering of a lead wire to the electrodes of the piezoelectric element (see JP-A-2004-320979 and JP-A-8-111991). Accordingly, it is necessary to ensure a space for the lead wire and disconnection may easily occur during a wiring operation.

SUMMARY

An advantage of some aspects of the invention is to solve at least a part of the problems described above, and the invention can be implemented as the following forms or application examples.

(1) An aspect of the invention provides a piezoelectric driving device including a vibrating plate and a piezoelectric vibrating body. A piezoelectric vibrating body includes a substrate, a piezoelectric body which is provided between the substrate and the vibrating plate, a first electrode which is provided between the piezoelectric body and the substrate, and a second electrode which is provided between the piezoelectric body and the vibrating plate. A wiring pattern electrically connected to at least one of the first electrode and the second electrode is formed on the vibrating plate.

According to the piezoelectric driving device, since the wiring pattern formed on the vibrating plate is electrically connected to at least one of the first electrode and the second electrode, it is possible to save space for the wirings and to decrease a possibility of disconnection, compared to a case where the first electrode and the second electrode are connected to the driving circuit using a lead wire or soldering.

(2) In the piezoelectric driving device according to aspect described above, the wiring pattern may include a first wiring which is electrically connected to the first electrode and a second wiring which is electrically connected to the second electrode.

With this configuration, since the first wiring and the second wiring of the wiring pattern of the vibrating plate are connected to the first electrode and the second electrode, it is possible to save space for the wirings and to decrease a possibility of disconnection.

(3) In the piezoelectric driving device according to aspect described above, the first electrode and the first wiring may be electrically connected to each other through a first laminated conducting portion, and the second electrode and the second wiring may be electrically connected to each other through a second laminated conducting portion.

With this configuration, since the first wiring and the second wiring of the wiring pattern of the vibrating plate are connected to the first electrode and the second electrode through the first laminated conducting portion and the second laminated conducting portion, it is possible to save space for the wirings and to decrease a possibility of disconnection, compared to a case of using a lead wire or soldering.

(4) The piezoelectric driving device according to aspect described above may further include a conducting pattern of at least one layer which is provided between the first electrode and the wiring pattern, and the first laminated conducting portion and the second laminated conducting portion may be formed on the conducting pattern of each layer.

With this configuration, it is possible to easily connect the first electrode and the second electrode of the piezoelectric element to the wiring pattern of the vibrating plate through the conducting pattern of one or more layers.

(5) In the piezoelectric driving device according to aspect described above, the conducting pattern at a position farthest from the substrate in a lamination direction among the conducting pattern of at least one layer, may be electrically connected to the wiring pattern of the vibrating plate so that the surfaces come in contact with each other.

With this configuration, since the conducting pattern at a position farthest from the substrate is electrically connected to the wiring pattern of the vibrating plate so that the surfaces come in contact with each other, it is possible to reliably and easily connect both patterns.

(6) In the piezoelectric driving device according to aspect described above, an insulating layer may be provided between the conducting pattern at a position closest to the second electrode in a lamination direction among the conducting pattern of at least one layer, and the second electrode, and the conducting pattern at a position closest to the second electrode and the second electrode may be electrically connected to each other through a plurality of contact holes provided on the insulating layer.

With this configuration, since the conducting pattern and the second electrode are connected to each other through the plurality of contact holes, it is possible to decrease sheet resistance (parasitic resistance) between both the conducting pattern and the second electrode.

(7) In the piezoelectric driving device according to aspect described above, the conducting pattern of at least one layer may include a first conducting pattern, a second conducting pattern, and an insulating layer which is provided between the first conducting pattern and the second conducting pattern, the first laminated conducting portion in the first conducting pattern and the first laminated conducting portion in the second conducting pattern may be electrically connected to each other through a plurality of contact holes provided on the insulating layer, and the second laminated conducting portion in the first conducting pattern and the second laminated conducting portion in the second conducting pattern may be electrically connected to each other through a plurality of contact holes provided on the insulating layer.

With this configuration, since the conducting patterns are electrically connected to each other through the plurality of contact holes, it is possible to decrease sheet resistance (parasitic resistance) between both the conducting patterns.

(8) In the piezoelectric driving device according to aspect described above, the vibrating plate may include a surface portion on which the piezoelectric vibrating body is not loaded, and the wiring pattern may be formed to be extended to a surface portion on which the piezoelectric vibrating body is not loaded.

With this configuration, it is possible to easily perform connection between the electrode of the piezoelectric element and the driving circuit.

(9) In the piezoelectric driving device according to aspect described above, the piezoelectric body may have a thickness of 0.05 μm to 20 μm.

With this configuration, since the conducting patterns are connected to each other through the plurality of contact holes and the sheet resistance (parasitic resistance) is decreased, it is possible to decrease a loss and increase efficiency, even when a piezoelectric body of a thin film having a thickness of 0.05 μm to 20 μm is used and a voltage applied to the piezoelectric body is increased.

(10) In the piezoelectric driving device according to above aspect, the vibrating plate may be formed with a conductive member, and a part of the wiring pattern may be formed over the side surface of the vibrating plate and may be electrically connected to the vibrating plate.

With this configuration, it is possible to easily connect the electrode of the piezoelectric element and the vibrating plate.

(11) In the piezoelectric driving device according to aspect described above, the piezoelectric vibrating body may include a plurality of piezoelectric elements configured with the first electrode, the piezoelectric body, and the second electrode, the plurality of piezoelectric elements may be divided into N sets (N is integer equal to or larger than 2) of piezoelectric element groups, when one or more piezoelectric elements driven at the same time are set as one set of piezoelectric element group, the second electrodes of two or more piezoelectric elements may be directly connected to each other through a connection wiring, when each set of the piezoelectric element group includes two or more piezoelectric elements, and N second wirings and N second laminated conducting portions may be provided to be insulated from each other, to correspond to each second electrode of the N sets of piezoelectric element groups.

With this configuration, it is possible to easily connect the second electrode of the N sets of piezoelectric element groups to N second wirings of the vibrating plate using N second laminated conducting portions.

(12) In the piezoelectric driving device according to aspect described above, a protrusion which may be provided on the vibrating plate and may come in contact with a body to be driven.

With this configuration, it is possible to cause a body to be driven to move using the protrusion.

The invention can be implemented in various forms, and, for example, can be implemented in various embodiments of various apparatuses, a driving method thereof such as a driving method of a piezoelectric driving device, a manufacturing method of a piezoelectric driving device, and a robot including a piezoelectric driving device mounted thereon, in addition to the piezoelectric driving device.

BRIEF DESCRIPTION OF THE DRAWINGS

The invention will be described with reference to the accompanying drawings, wherein like numbers reference like elements.

FIGS. 7A to 7H are explanatory diagrams showing a manufacturing process of the piezoelectric vibrating body in Step S100 of FIG. 6.

DESCRIPTION OF EXEMPLARY EMBODIMENTS

First Embodiment

Figure 1A:
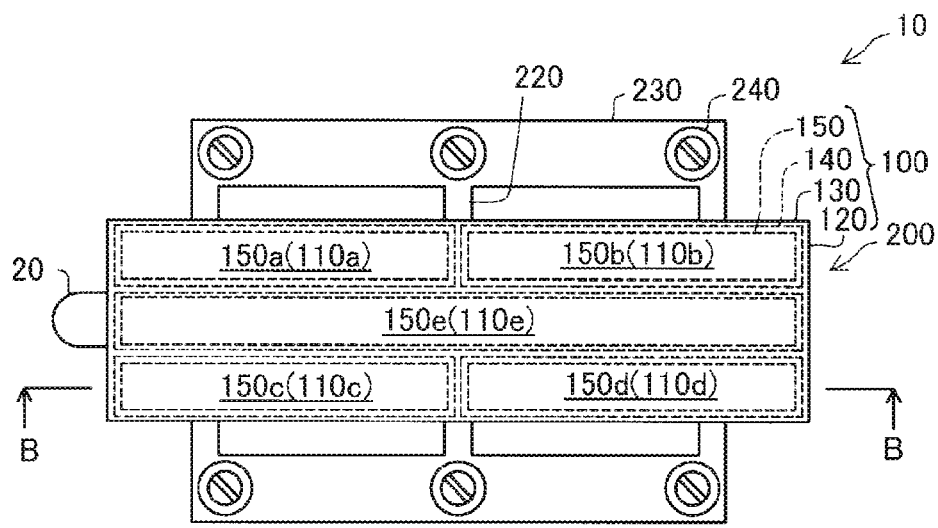
FIGS. 1A and 1B are respectively a plan view and a sectional view showing a schematic configuration of a piezoelectric driving device of a first embodiment.
Figure 1B:
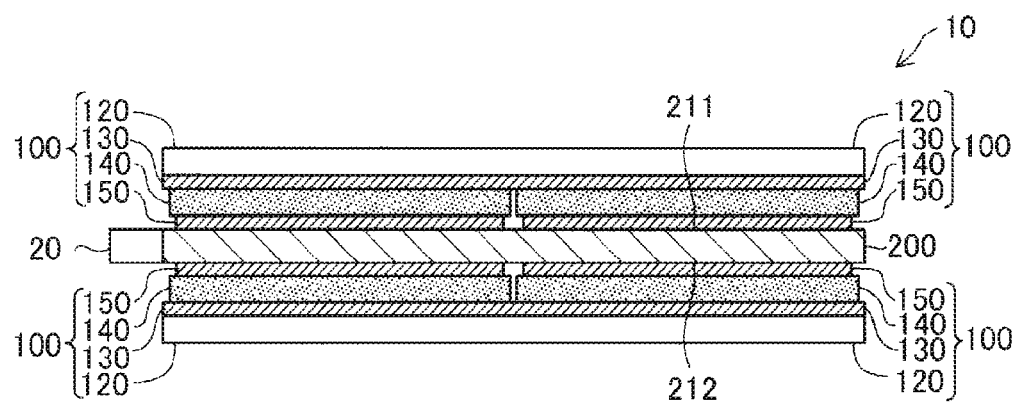

FIG. 1A is a plan view showing a schematic configuration of a piezoelectric driving device 10 of a first embodiment of the invention and FIG. 1B is a sectional view taken along line B-B. A piezoelectric driving device 10 includes a vibrating plate 200, and two piezoelectric vibrating bodies 100 respectively disposed on both surfaces (a first surface 211 and a second surface 212) of the vibrating plate 200. Each of the piezoelectric vibrating bodies 100 include a substrate 120, a first electrode 130 formed on the substrate 120, a piezoelectric body 140 formed on the first electrode 130, and a second electrode 150 formed on the piezoelectric body 140. The first electrode 130 and the second electrode 150 configure piezoelectric elements by interposing the piezoelectric body 140 therebetween. The two piezoelectric vibrating bodies 100 are symmetrically disposed with the vibrating plate 200 as a center. In the embodiment, the piezoelectric vibrating body 100 is installed on the vibrating plate 200 so that the piezoelectric elements (130, 140, and 150) are interposed between the substrate 120 and the vibrating plate 200. Since the two piezoelectric vibrating bodies 100 have the same configuration, the configuration of the piezoelectric vibrating body 100 on the lower side of the vibrating plate 200 will be described hereinafter, unless otherwise noted.

The substrate 120 of the piezoelectric vibrating body 100 is used as a substrate for forming the first electrode 130, the piezoelectric body 140, and the second electrode 150 in a film forming process. The substrate 120 also has a function as a vibrating plate which performs mechanical vibration. The substrate 120 can be formed of Si, $Al_2O_3$, or $ZrO_2$, for example. As the substrate 120 formed of Si, a Si wafer for semiconductor manufacturing can be used, for example. In the embodiment, a planar shape of the substrate 120 is a rectangle. A thickness of the substrate 120 is, for example, preferably in a range of 10 μm to 100 μm. When the thickness of the substrate 120 is equal to or greater than 10 μm, it is possible to comparatively easily treat the substrate 120, at the time of performing a film forming process on the substrate 120. When the thickness of the substrate 120 is equal to or smaller than 100 μm, it is possible to easily vibrate the substrate 120 according to expansion and contraction of the piezoelectric body 140 formed of a thin film.

The first electrode 130 is formed as one continuous conductor layer which is formed on the substrate 120. Meanwhile, as shown in FIG. 1A, the second electrode 150 is divided into five conductor layers 150a to 150e (also referred to as "second electrodes 150a to 150e"). The second electrode 150e in the center is formed to have a rectangular shape over substantially all of the substrate 120 in a longitudinal direction, in the center of the substrate 120 in a width direction. The other four second electrodes 150a, 150b, 150c, and 150d have the same planar shape and are formed at four corners of the substrate 120. In the example of FIGS. 1A and 1B, both the first electrode 130 and the second electrode 150 have a rectangular planar shape. The first electrode 130 or the second electrode 150 is a thin film which is formed by sputtering, for example. As a material of the first electrode 130 or the second electrode 150, any material having high conductivity such as Al (aluminum), Ni (nickel), Au (gold), Pt (platinum), or Ir (iridium) can be used, for example. In addition, instead of setting the first electrode 130 as one continuous conductor layer, the first electrode may be divided into five conductor layers having planar shapes which are substantially the same as those of the second electrodes 150a to 150e. Wiring (or a wiring layer or an insulating layer) for electrically connecting the second electrodes 150a to 150e with each other and wiring (or a wiring layer or an insulating layer) for electrically connecting the first electrode 130, the second electrodes 150a to 150e, and a driving circuit with each other are not shown in FIGS. 1A and 1B.

The piezoelectric body 140 is formed as five piezoelectric layers having planar shapes which are substantially the same as those of the second electrodes 150a to 150e. Instead of that, the piezoelectric body 140 may be formed as one continuous piezoelectric layer having a planar shape substantially the same as that of the first electrode 130. Five piezoelectric elements 110a to 110e (FIG. 1A) are configured by the laminated structure of the first electrode 130, the piezoelectric body 140, and the second electrodes 150a to 150e.

The piezoelectric body 140 is a thin film which is formed by a sol-gel method or a sputtering method, for example. As a material of the piezoelectric body 140, any material exhibiting a piezoelectric effect such as ceramics having an $ABO_3$ type perovskite structure can be used. Examples of the ceramics having an $ABO_3$ type perovskite structure include lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, zinc niobate lead, and scandium niobate. As a material exhibiting a piezoelectric effect other than the ceramics, polyvinylidene fluoride or crystal can also be used, for example. A thickness of the piezoelectric body 140 is, for example, preferably in a range of 50 nm (0.05 μm) to 20 μm. A thin film of the piezoelectric body 140 having a thickness of this range can easily be formed by using a film forming process. When the thickness of the piezoelectric body 140 is equal to or greater than 0.05 μm, it is possible to generate sufficiently great power according to expansion and contraction of the piezoelectric body 140. When the thickness of the piezoelectric body 140 is equal to or smaller than 20 μm, it is possible to sufficiently miniaturize the piezoelectric driving device 10.

Figure 2:
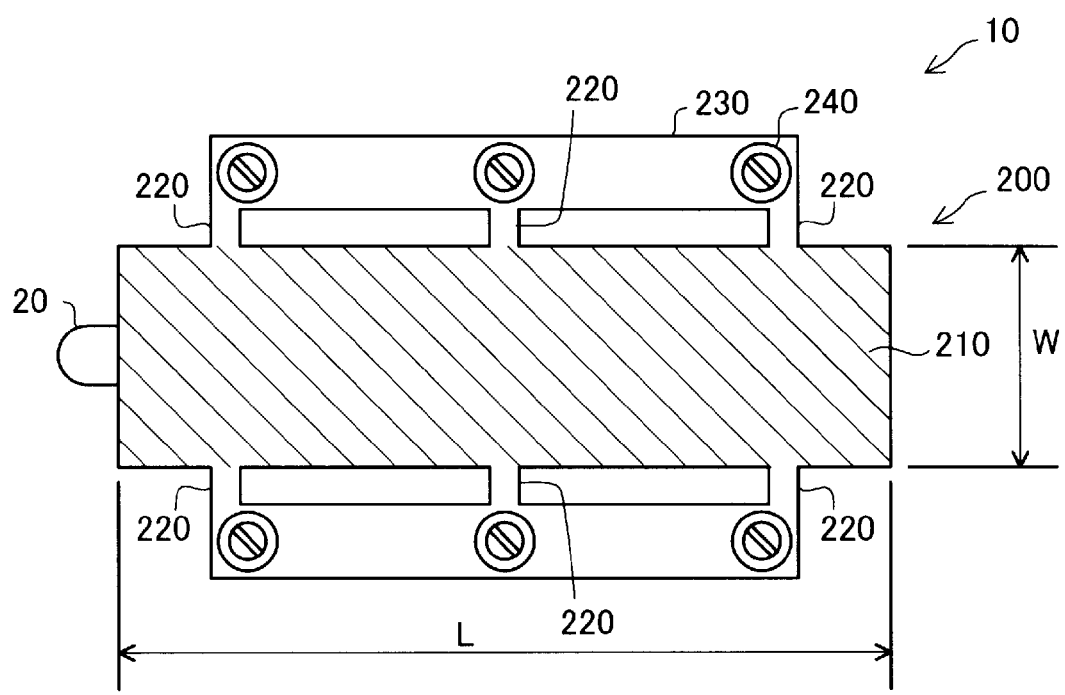
FIG. 2 is a plan view of a vibrating plate.

FIG. 2 is a plan view of the vibrating plate 200. The vibrating plate 200 includes a rectangular vibrator portion 210, three connection portions 220 which extend from right and left long sides of the vibrator portion 210, and two attachment portions 230 which are connected to the respective three connection portions 220 on both right and left sides. In FIG. 2, for convenience of description, an area of the vibrator portion 210 is hatched. The attachment portions 230 are used for attaching the piezoelectric driving device 10 to another member with screws 240. The vibrating plate 200, for example, can be formed with a metal material such as stainless steel, aluminum, an aluminum alloy, titanium, a titanium alloy, copper, a copper alloy, or an iron-nickel alloy.

The piezoelectric vibrating bodies 100 (FIGS. 1A and 1B) are respectively mounted on an upper surface (first surface 211) and a lower surface (second surface 212) of the vibrator portion 210 using an adhesive. A ratio of a length L and a width W of the vibrator portion 210 is preferably approximately L:W=about 7:2. This ratio is a preferable value for performing ultrasonic vibration (which will be described later) in which the vibrator portion 210 curves to the right and left along the flat surface thereof. The length L of the vibrator portion 210 can be set, for example, in a range of 3.5 mm to 30 mm and the width W thereof can be set, for example, in a range of 1 mm to 8 mm. Since the vibrator portion 210 performs ultrasonic vibration, the length L thereof is preferably equal to or smaller than 50 nm. A thickness of the vibrator portion 210 (thickness of vibrating plate 200) can be set, for example, in a range of 50 µm to 700 µm. When the thickness of the vibrator portion 210 is equal to or greater than 50 µm, sufficient rigidity for supporting the piezoelectric body 100 is obtained. When the thickness of the vibrator portion 210 is equal to or smaller than 700 µm, sufficiently great deformation can occur according to deformation of the piezoelectric body 100.

A protrusion 20 (also referred to as a "contacting portion" or an "operating portion") is provided on one short side of the vibrating plate 200. The protrusion 20 is a member which comes in contact with a body to be driven to apply force to a body to be driven. The protrusion 20 is preferably formed of a material having durability such as ceramics (for example, $Al_2O_3$).

Figure 3:
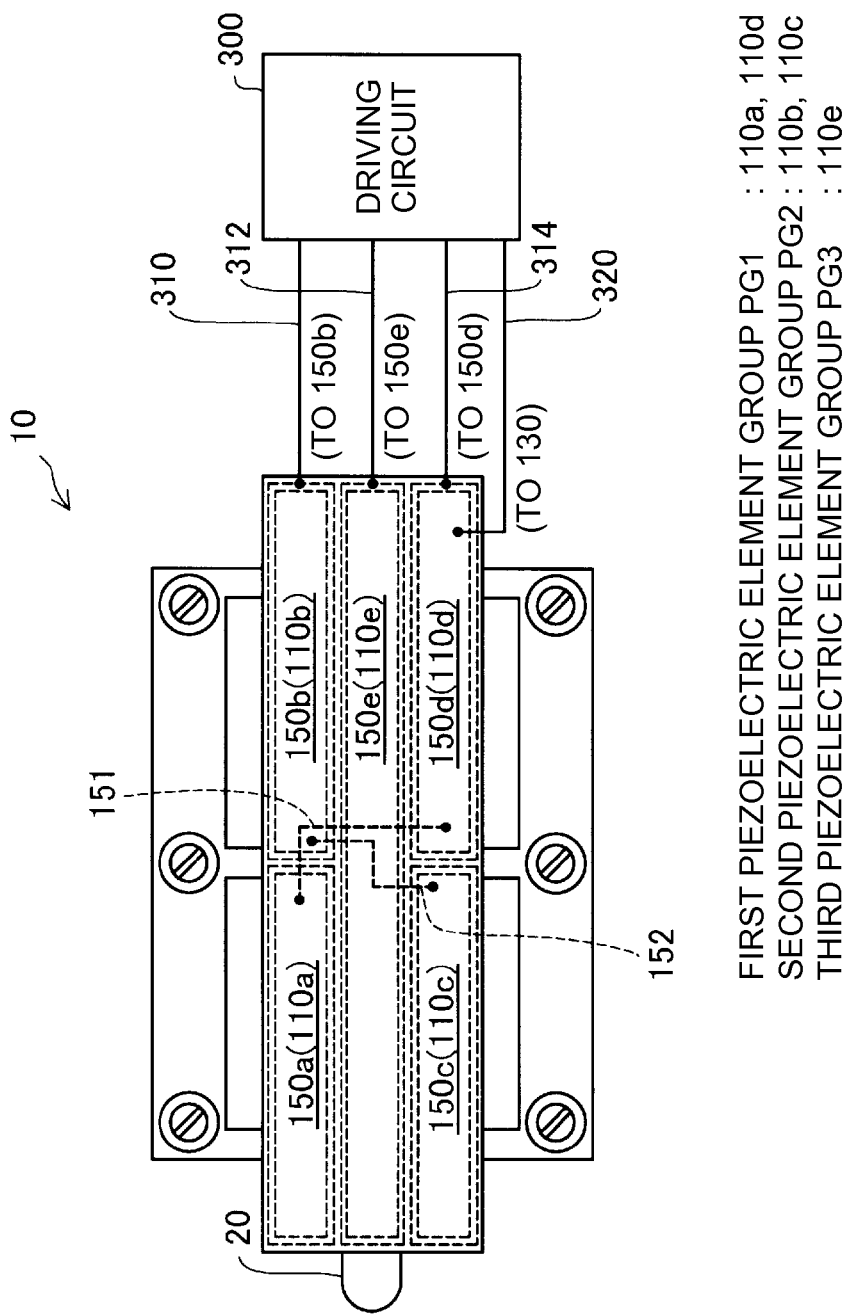
FIG. 3 is an explanatory diagram showing an electrical connection state of the piezoelectric driving device and a driving circuit.

FIG. 3 is an explanatory diagram showing an electrical connection state of the piezoelectric driving device 10 and a driving circuit 300. Among the five second electrodes 150a to 150e, a pair of diagonal second electrodes 150a and 150d are electrically connected to each other through a wiring 151, and another pair of diagonal second electrodes 150b and 150c are also electrically connected to each other through a wiring 152. The wirings 151 and 152 may be formed by a film forming process or may be implemented by wire-shaped wiring. The three second electrodes 150b, 150e, and 150d disposed on the right side of FIG. 3 and the first electrode 130 (FIGS. 1A and 1B) are electrically connected to the driving circuit 300 through wirings 310, 312, 314, and 320. By applying an AC voltage or an undulating voltage which periodically changes, between a pair of second electrodes 150a and 150d and the first electrode 130, the driving circuit 300 can cause the piezoelectric driving device 10 to perform ultrasonic vibration and rotate a rotor (body to be driven) which comes in contact with the protrusion 20, in a predetermined rotation direction. Herein, the "undulating voltage" means a voltage obtained by applying DC offset to the AC voltage, and a direction of the voltage (electric field) thereof is a direction from one electrode to the other electrode. In addition, by applying an AC voltage or an undulating voltage between another pair of second electrodes 150b and 150c and the first electrode 130, a rotor which comes in contact with the protrusion 20 can be rotated in a reverse direction. The application of the voltage can be simultaneously performed on the two piezoelectric vibrating bodies 100 provided on both surfaces of the vibrating plate 200. A wiring (or a wiring layer or an insulating layer) configuring the wirings 151, 152, 310, 312, 314, and 320 shown in FIG. 3 is not shown in FIGS. 1A and 1B.

In the embodiment shown in FIG. 3, the five piezoelectric elements 110a to 110e are divided into the following three sets of piezoelectric element groups.

(1) first piezoelectric element group PG1: piezoelectric elements 110a and 110d
(2) second piezoelectric element group PG2: piezoelectric elements 110b and 110c
(3) third piezoelectric element group PG3: piezoelectric element 110e The piezoelectric element 110 included in each piezoelectric element group is driven at the same time in any case. Since the first piezoelectric element group PG1 includes the two piezoelectric elements 110a and 110d, the second electrodes 150a and 150d of the piezoelectric elements 110a and 110d are directly connected to each other through a connection wiring 151. The same applies to the second piezoelectric element group PG2. As another embodiment, one set of the piezoelectric element group can also be configured with three or more piezoelectric elements 110, and in general, the plurality of piezoelectric elements can be divided into N sets (N is an integer equal to or larger than 2) of the piezoelectric element groups. In this case, when two or more piezoelectric elements 110 are included in the same piezoelectric element group, the second electrodes 150 are directly connected to each other through a connection wiring. Herein, "to be directly connected through a connection wiring" means that the connection wiring does not include a passive element (a resistor, a coil, or a capacitor) or an active element. In the embodiment, one conductor layer common to the five piezoelectric elements 110a to 110e is used as the first electrode 130, but when the first electrode 130 is separate for each piezoelectric element, it is preferable that the first electrodes of the two or more piezoelectric elements belonging to the same piezoelectric element group are also directly connected to each other through a connection wiring.

Figure 4A:
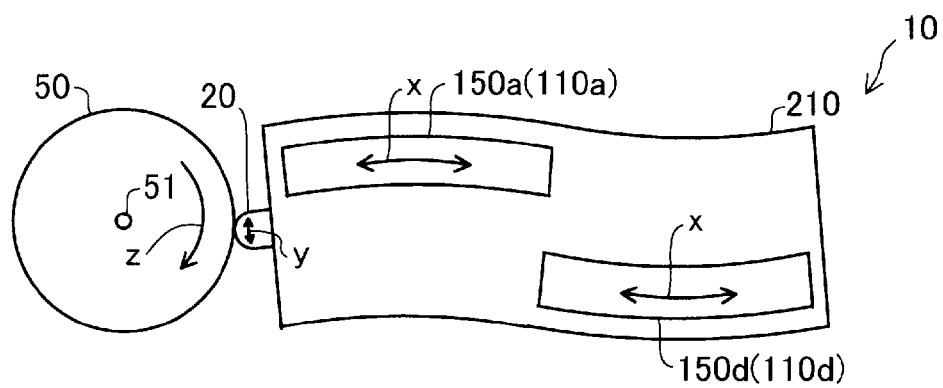
FIGS. 4A to 4C are explanatory diagrams showing an example of operations of the piezoelectric driving device.
Figure 4B:
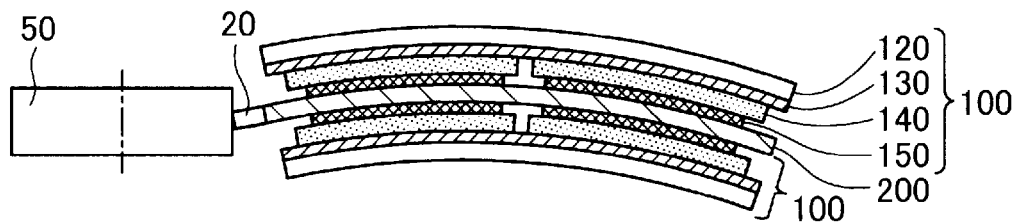
Figure 4C:
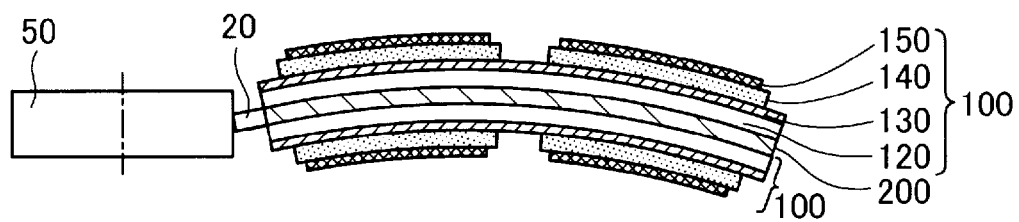

FIGS. 4A to 4C are explanatory diagrams showing an example of operations of the piezoelectric driving device 10. The protrusion 20 of the piezoelectric driving device 10 comes in contact with an outer circumference of a rotor 50 which is a body to be driven. In an example shown in FIG. 4A, the driving circuit 300 (FIG. 3) applies an AC voltage or an undulating voltage between a pair of second electrodes 150a and 150d and the first electrode 130, and accordingly, the piezoelectric elements 110a and 110d expand or contract in a direction of an arrow x shown in FIG. 4A. According to this, the vibrator portion 210 of the piezoelectric driving device 10 curves in a flat surface of the vibrator portion 210 to be deformed in a meander shape (S shape), and a tip end of the protrusion 20 performs a reciprocal operation or an elliptic operation in a direction of an arrow y. As a result, the rotor 50 is rotated around the center 51 thereof in a predetermined direction z (clockwise in FIG. 4A). The three connection portions 220 (FIG. 2) of the vibrating plate 200 described in FIG. 2 are provided at a position of a node of vibration of the vibrator portion 210. When the driving circuit 300 applies an AC voltage or an undulating voltage between another pair of second electrodes 150b and 150c and the first electrode 130, the rotor 50 is rotated in a reverse direction. When the same voltage as that applied to a pair of second electrodes 150a and 150d (or another pair of second electrodes 150b and 150c) is applied to the second electrode 150e in the center, the piezoelectric driving device 10 expands and contracts in a longitudinal direction, and accordingly, it is possible to increase the magnitude of force applied to the rotor 50 from the protrusion 20. Such an operation regarding the piezoelectric driving device 10 (or piezoelectric vibrating body 100) is disclosed in JP-A-2004-320979 or U.S. Pat. No. 7,224,102 thereof, and the disclosed content thereof is incorporated by reference.

FIG. 4B shows a state where the piezoelectric driving device 10 also curves in a thickness direction when being vibrated in a plane direction thereof, as shown in FIG. 4A. The curvature in such a thickness direction is not desirable, because distortion may occur on the surface of the piezoelectric driving device 10. However, in the piezoelectric driving device 10 of the embodiment, since the piezoelectric vibrating body 100 is provided on the vibrating plate 200 so that the piezoelectric elements (130, 140, and 150) are interposed between the substrate 120 and the vibrating plate 200, it is possible to prevent such undesirable distortion by the substrate 120. In the opposite manner to the example of FIG. 4B, FIG. 4C shows an example in which the piezoelectric vibrating body 100 is installed on the vibrating plate 200 so that the substrate 120 comes in contact with the vibrating plate 200. In a laminated structure of FIG. 4C, undesirable distortion may be excessively increased on the surface of the second electrode 150. Accordingly, as shown in FIG. 4B, the piezoelectric vibrating body 100 is preferably installed on the vibrating plate 200 so that the piezoelectric elements (130, 140, and 150) are interposed between the substrate 120 and the vibrating plate 200. By doing so, it is possible to decrease a possibility of break-down or damaging of the piezoelectric driving device 10. Particularly, the substrate 120 is preferably formed of silicon, because the substrate is hardly damaged due to distortion.

Figure 5:
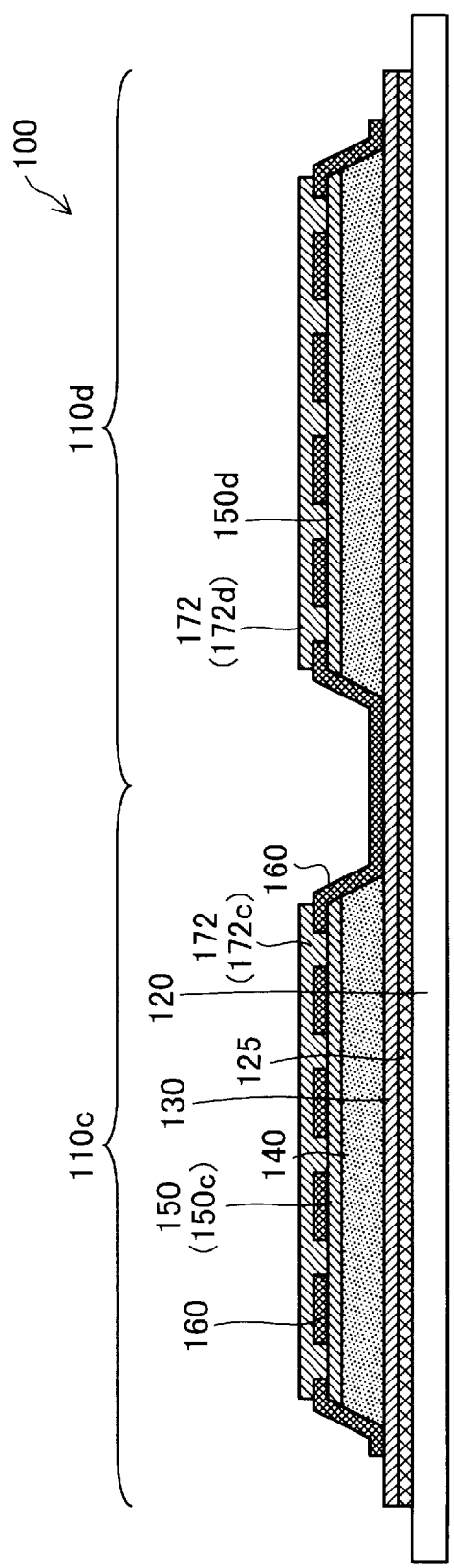
FIG. 5 is a sectional view of a piezoelectric vibrating body.

FIG. 5 is a sectional view more specifically showing an example of a sectional structure of the piezoelectric vibrating body 100 shown in FIG. 1B. The piezoelectric vibrating body 100 includes the substrate 120, an insulating layer 125, the first electrode 130, the piezoelectric body 140, the second electrodes 150, insulating layers 160, and a laminated conducting portion 172. In FIG. 5, regarding the plurality of second electrodes 150 and the plurality of laminated conducting portions 172, an index "c" or "d" is used for distinction. In FIG. 5, the wirings 151 and 152 shown in FIG. 3 are not shown. In this specification, an expression of the "laminated conducting portion" means a conductor which is formed by a film forming process (laminating process) such as vapor deposition, sputtering, ion plating, or plating.

The insulating layer 125 is formed on the substrate 120 and insulates the substrate 120 and the first electrode 130 from each other. The first electrode 130 is formed on the insulating layer 125. The piezoelectric body 140 is formed on the first electrode 130. The second electrode 150 is formed on the piezoelectric body 140. The insulating layer 160 is formed on the second electrode 150. In a plan view, the first electrode 130 preferably has a portion not overlapping the piezoelectric body 140 (in FIG. 5, a portion of the piezoelectric body 140 exposed to the left and right sides). The reason thereof is because the first electrode 130 is easily connected to a wiring pattern (which will be described later) formed on the vibrating plate 200. The laminated conducting portion 172 is connected with the first electrode 130. The insulating layer 160 has openings (contact holes) on some parts thereof, so that the laminated conducting portion 172 comes into contact with the second electrode 150. In addition, a plurality of contact holes are preferably formed on the insulating layer 160. This point will be further described later.

Figure 6:
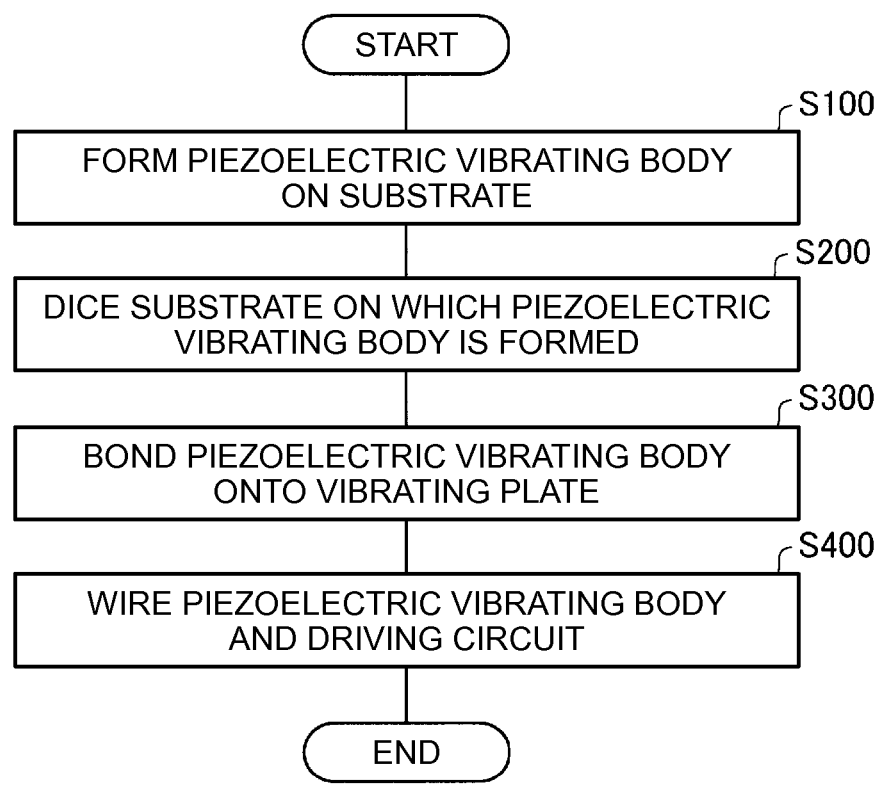
FIG. 6 is a flowchart showing manufacturing of the piezoelectric driving device.

FIG. 6 is a flowchart showing manufacturing of the piezoelectric driving device 10. In Step S100, the piezoelectric elements 110 are formed on the substrate 120, and accordingly, the piezoelectric vibrating body 100 is formed. At that time, an Si wafer can be used, as the substrate 120, for example. The plurality of piezoelectric vibrating bodies 100 can be formed on one Si wafer. In addition, since Si has a great value of a mechanical quality factor Qm which is approximately 100,000, it is possible to increase the mechanical quality factor Qm of the piezoelectric vibrating body 100 or the piezoelectric driving device 10. In Step S200, the substrate 120 formed on the piezoelectric vibrating body 100 is diced and divided into each of the piezoelectric vibrating bodies 100. A rear surface of the substrate 120 may be ground before dicing the substrate 120 to have a desired thickness of the substrate 120. In Step S300, the two piezoelectric vibrating bodies 100 are bonded to both surfaces of the vibrating plate 200 with an adhesive. In Step S400, a wiring layer of the piezoelectric vibrating bodies 100 and the driving circuit are electrically connected to each other.

FIGS. 7A to 7H are explanatory diagrams showing a manufacturing process of the piezoelectric vibrating body 100 in Step S100 of FIG. 6. FIGS. 7A to 7H show a process of forming the piezoelectric element 110d shown on the upper right portion of FIG. 5 on the substrate 120. In Step S110, the substrate 120 is prepared and the insulating layer 125 is formed on the surface of the substrate 120. An $SiO_2$ layer which is formed by thermal oxidation of the surface of the substrate 120 can be used, for example, as the insulating layer 125. In addition, an organic material such as alumina ($Al_2O_3$), acryl or polyimide can be used as the insulating layer. When the substrate 120 is an insulator, a step of forming the insulating layer 125 can be omitted.

In Step S120, the first electrode 130 is formed on the insulating layer 125. The first electrode 130 can be formed by sputtering, for example.

In Step S130, the piezoelectric body 140 is formed on the first electrode 130. Specifically, the piezoelectric body 140 can be formed using a sol-gel method, for example. That is, a sol-gel solution which is a piezoelectric body material is added dropwise onto the substrate 120 (first electrode 130), high-speed rotation of the substrate 120 is performed, and accordingly, a thin film of the sol-gel solution is formed on the first electrode 130. Then, the thin film is calcined at a temperature of 200° C. to 300° C. to form a first layer of the piezoelectric body material on the first electrode 130. After that, by repeating the cycle of the dropping of the sol-gel solution, the rapid-speed rotation, and the calcination several times, a piezoelectric layer having a desired thickness is formed on the first electrode 130. A thickness of one layer of the piezoelectric body formed in one cycle depends on the viscosity of the sol-gel solution or a rotation rate of the substrate 120, and is approximately from 50 nm to 150 nm. After forming the piezoelectric layer having a desired thickness, the piezoelectric layer is sintered at a temperature of 600° C. to 1,000° C. to form the piezoelectric body 140. When the thickness of the piezoelectric body 140 after sintering is set to be from 50 nm (0.05 µm) to 20 µm it is possible to implement the miniaturized piezoelectric driving device 10. When the thickness of the piezoelectric body 140 is set to be equal to or greater than 0.05 µm, it is possible to generate a sufficiently great enough force according to the expansion and contraction of the piezoelectric body 140. When the thickness of the piezoelectric body 140 is set to be equal to or smaller than 20 µm, it is possible to generate a sufficiently great enough force, even when a voltage to be applied to the piezoelectric body 140 is equal to or smaller than 600 V. As a result, it is possible to configure the driving circuit 300 for driving the piezoelectric driving body 10 with an inexpensive element. The thickness of the piezoelectric body may be equal to or greater than 8 µm and in this case, it is possible to increase an amount of force generated by the piezoelectric element. The temperature or time of calcining or sintering is merely an example and is appropriately selected depending on the piezoelectric body material.

When the thin film of the piezoelectric body material is formed and sintered using a sol-gel method, there are advantages that (a) a thin film is easily formed, (b) crystallization is easily performed in a grating direction, and (c) withstanding pressure of the piezoelectric body can be improved, when compared to a sintering method of the related art of mixing and sintering raw material powder.

In Step S140, the second electrode 150 is formed on the piezoelectric body 140. In the same manner as in the case of the first electrode, the formation of the second electrode 150 can be performed by sputtering.

In Step S150, the second electrode 150 and the piezoelectric body 140 are patterned. In the embodiment, by performing ion milling using an argon ion beam, the patterning of the second electrode 150 and the piezoelectric body 140 is performed. By controlling the time of ion milling, only the second electrode 150 and the piezoelectric body 140 may be patterned and the first electrode 130 may not be patterned. Instead of performing the patterning using ion milling, the patterning may be performed by other arbitrary patterning methods (for example, dry etching using chlorinated gas).

In Step S160, the insulating layer 160 is formed on the first electrode 130 and the second electrode 150. As the insulating layer 160, a phosphorous-containing silicon oxide film (PSG film), a boron.phosphorous-containing silicon oxide film (BPSG film), a silicon oxide film not containing impurities such as boron or phosphorous (NSG film), or a silicon nitride film ($Si_3N_4$ film) can be used. The insulating layer 160 can be formed by a CVD method, for example. After forming the insulating layer 160, patterning is performed for forming the plurality of contact holes 160c for connection of the second electrode 150.

In Step S170, the conductor layer is formed and patterning is performed. This conductor layer can be formed using aluminum, for example, and is formed by sputtering. After that, by patterning the conductor layer, the second laminated conducting portion 172 connected to the second electrode 150 is formed.

Figure 8A:
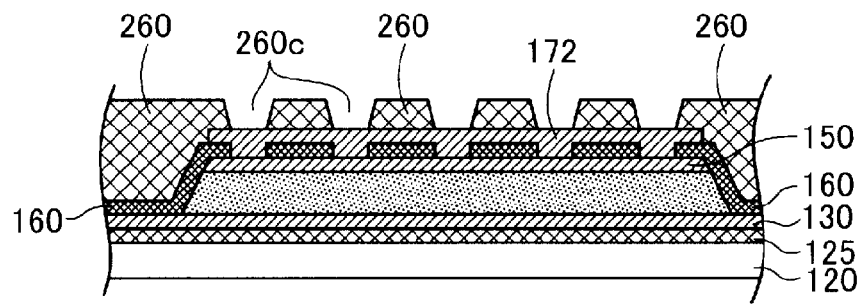
FIGS. 8A to 8C are explanatory diagrams showing a process subsequent to the process of FIG. 7H.
Figure 8B:
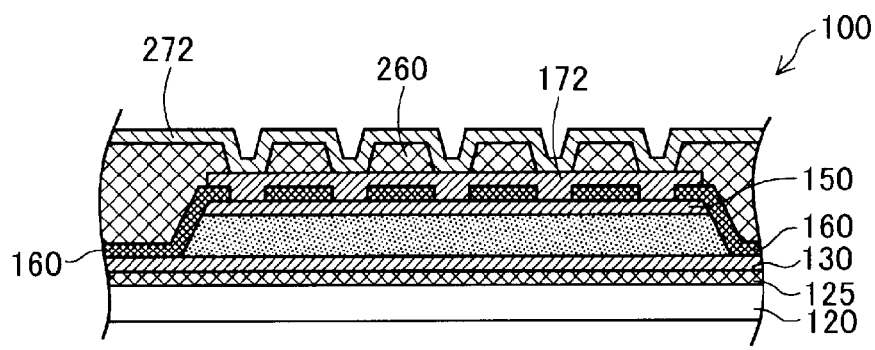
Figure 8C:
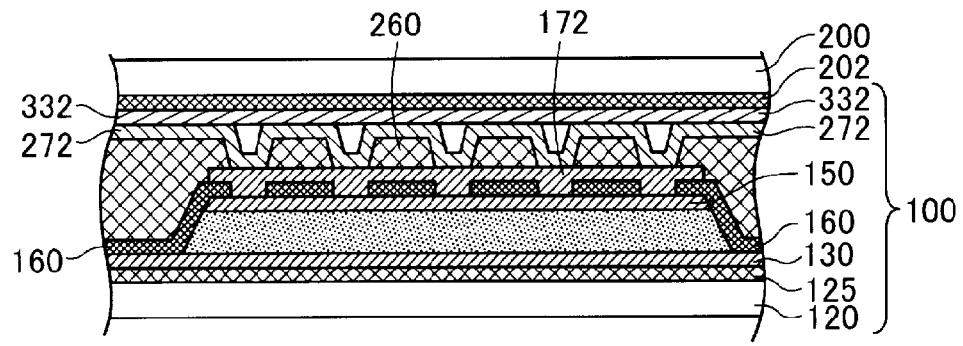

FIGS. 8A to 8C are explanatory diagrams showing a process subsequent to the process of FIG. 7H. In FIG. 8A, an insulating layer 260 is formed on the laminated structure of FIG. 7H and the plurality of contact holes 260c are formed by patterning the insulating layer. In FIG. 8B, a second laminated conducting portion 272 is formed over the entire surface of the laminated structure by sputtering. By performing the steps in FIGS. 7A to 8B, the formation of the piezoelectric vibrating body 100 in which the second laminated conducting layers 172 and 272 connected to the second electrode 150 are formed, is completed on the piezoelectric elements (130, 140, and 150). Also, regarding the first electrode 130, one or more first laminated conducting portions connected to the first electrode 130 are formed, but are omitted in FIGS. 7A to 8C.

FIG. 8C shows a process of bonding the piezoelectric vibrating body 100 to the vibrating plate 200 in Step S300 of FIG. 6. Before the Step Shown in FIG. 8C, an insulating layer 202 is formed on the surface of the vibrating plate 200 and a wiring pattern including a wiring 332 is formed on the insulating layer 202. The insulating layer 202 can be formed by applying an insulating resin such as polyimide, for example. In FIG. 8C, the piezoelectric vibrating body 100 manufactured by performing the processes of FIGS. 7A to 8C is attached to the vibrating plate 200 using an adhesive. At that time, the piezoelectric vibrating body 100 is installed on the vibrating plate 200 so that the piezoelectric elements (130, 140, and 150) are interposed between the substrate 120 of the piezoelectric vibrating body 100 and the vibrating plate 200. In FIG. 8C, another piezoelectric vibrating body 100 attached to the lower surface of the vibrating plate 200 is omitted.

Figure 9A:
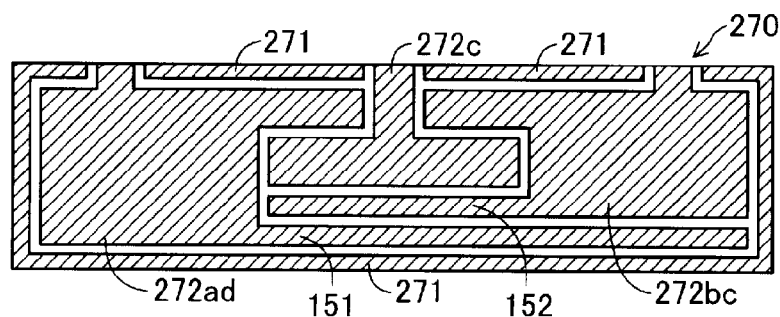
FIGS. 9A to 9E are plan views showing an example of various wiring layers or insulating layers.
Figure 9B:
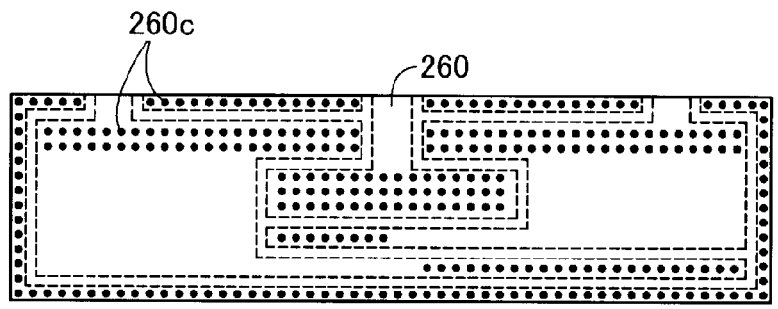
Figure 9C:
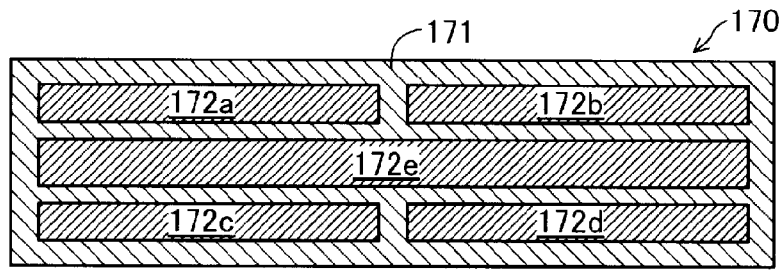
Figure 9D:
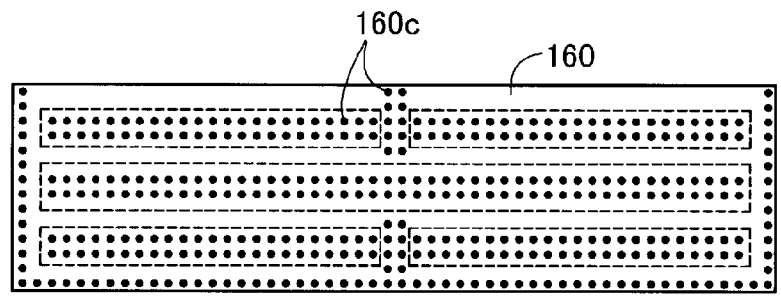
Figure 9E:
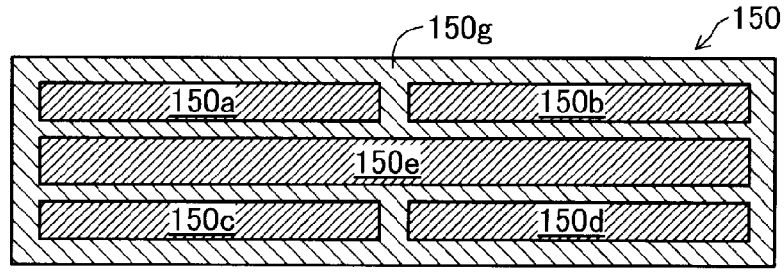

FIGS. 9A to 9E are plan views showing an example of various wiring layers and insulating layers shown in FIG. 8C. These are arranged in the order of lamination and each layer will be described in the order from FIG. 9E showing the lowermost layer to FIG. 9A showing the uppermost layer. FIG. 9E shows a conducting layer pattern including the second electrode 150. This conducting layer pattern includes five second electrodes 150a to 150e for the five piezoelectric elements 110a to 110e (FIG. 3) and further includes a first laminated conducting portion 150g surrounding the outer circumference thereof. This first laminated conducting portion 150g is connected to the first electrode 130. The five second electrodes 150a to 150e and the first laminated conducting portion 150g are separated from each other and are insulated from each other by an insulating layer, but the insulating layer is omitted in FIG. 9E. In FIGS. 7A to 8C described above, the first laminated conducting portion 150g is omitted. Various patterns for the first electrode 130 which is provided on each layer of FIGS. 9A to 9D described below are also omitted in FIGS. 7A to 8C.

FIG. 9D shows the insulating layer 160 which is formed on the conducting layer pattern of the second electrode 150. A broken line shows an outline of the five second electrodes 150a to 150e of FIG. 9E for reference. As described in FIG. 7G, the plurality of contact holes 160c are formed on the insulating layer 160. More specifically, the contact holes 160c are substantially evenly formed over the entire area of five areas corresponding to the five second electrodes 150a to 150e. The plurality of contact holes 160c are also formed in an area corresponding to the first laminated conducting portion 150g for the first electrode 130. The first laminated conducting portion 150g is formed along all of the four sides of the substrate 120 and the plurality of contact holes 160c are formed in areas corresponding to three sides among the four sides.

FIG. 9C shows a conducting pattern 170 which is formed on the insulating layer 160. This conducting pattern 170 is a conducting pattern which is in a position closest to the second electrode 150 in a lamination direction. The conducting pattern 170 includes one first laminated conducting portion 171 which is connected to the first electrode 130, and five second laminated conducting portions 172a to 172e which are connected to the five second electrodes 150a to 150e. The first laminated conducting portion 171 is connected to the first electrode 130 through the plurality of contact holes 160c of the insulating layer 160 and the first laminated conducting portion 150g (FIG. 9E) on the lower layer side. In addition, the five second laminated conducting portions 172a to 172e are respectively connected to the second electrodes 150a to 150e through the plurality of contact holes 160c of the insulating layer 160.

FIG. 9B shows the insulating layer 260 which is formed on the conducting pattern 170. A broken line shows an outline of the second laminated conducting portions shown in FIG. 9A for reference. As described in FIG. 8A, the plurality of contact holes 260c are formed on the insulating layer 260.

FIG. 9A shows a conducting pattern 270 which is formed on the uppermost portion of the piezoelectric vibrating body 100. This conducting pattern 270 is a conducting pattern 270 which is in a position farthest from the substrate 120 in the lamination direction. The conducting pattern 270 includes a first laminated conducting portion 271 which is connected to the first electrode 130 and three second laminated conducting portions 272ad, 272bc, and 272e which are connected to three sets of the second electrodes (150a+150d), (150b+150c), and 150e corresponding to the three sets of the piezoelectric element groups PG1, PG2, and PG3 described in FIG. 3.

The second laminated conducting portion 272*ad* for the first piezoelectric element group PG1 is connected to the two second laminated conducting portions 172*a* and 172*d* of FIG. 9C through the plurality of contact holes 260*c* of the insulating layer 260 of FIG. 9B, and accordingly, the second laminated conducting portion 272*ad* is further connected to the two second electrodes 150*a* and 150*d* through the plurality of contact holes 160*c* of the insulating layer 160 of FIG. 9D. The second laminated conducting portion 272*ad* is extended from an area corresponding to the second laminated conducting portion 172*a* of FIG. 9C to an area corresponding to the second laminated conducting portion 172*d* through areas corresponding to the other two adjacent second laminated conducting portions 172*e* and 172*c* in this order, to be connected to the two second laminated conducting portions 172*a* and 172*d* of FIG. 9C. An area of the second laminated conducting portion 272*ad* which is on the upper part of the second laminated conducting portions 172*e* and 172*c* not electrically connected to the second laminated conducting portion 272*ad*, corresponds to the connection wiring 151 shown in FIG. 3. In the insulating layer 260 of FIG. 9B, the contact holes 260*c* are formed only in a part of the area (shown with a broken line) corresponding to the second laminated conducting portion 272*ad* which corresponds to the second laminated conducting portions 172*a* and 172*d* connected to the second laminated conducting portion 272*ad*. As a result, it is possible to form a connection structure in which the second laminated conducting portion 272*ad* is connected to the second laminated conducting portions 172*a* and 172*d* on the lower layer side and is not connected to the other laminated conducting portions 171, 172*b*, 172*c*, and 172*e* on the lower layer side. The connection structure relating to the second laminated conducting portion 272*ad* for the first piezoelectric element group PG1 is substantially the same as that of the second laminated conducting portion 272*bc* for the second piezoelectric element group PG2. In addition, these two second laminated conducting portions 272*ad* and 272*bc* do not intersect each other and are separated and insulated from each other.

The second laminated conducting portion 272*e* for the third piezoelectric element group PG3 is connected to the second laminated conducting portion 172*e* of FIG. 9C through the plurality of contact holes 260*c* of the insulating layer 260 of FIG. 9B, and accordingly, the second laminated conducting portion 272*e* is further connected to the second electrode 150*e* through the plurality of contact holes 160*c* of the insulating layer 160 of FIG. 9D. This second laminated conducting portion 272*e* does not intersect the other two second laminated conducting portions 272*ad* and 272*bc*, either, and these are separated and insulated from each other. As described above, in the embodiment, the three second laminated conducting portions 272*ad*, 272*bc*, and 272*e* are provided in a state of being insulated from each other, to correspond to the three sets of piezoelectric element groups PG1, PG2, and PG3. As a result, it is possible to separately drive the three sets of piezoelectric element groups PG1, PG2, and PG3. In general, when the plurality of piezoelectric elements 110 are divided into N sets (N is an integer equal to or larger than 2) of the piezoelectric element groups, the second laminated conducting portions are preferably provided in a state of being insulated from each other.

The first laminated conducting portion 271 for the first electrode 130 is connected to the first laminated conducting portion 171 of FIG. 9C through the plurality of contact holes 260*c* of the insulating layer 260 of FIG. 9B, accordingly, is further connected to the first laminated conducting portion 150*g* of FIG. 9E through the plurality of contact holes 160*c* of the insulating layer 160 of FIG. 9D, and is connected to the first electrode 130 through the first laminated conducting portion 150*g*.

Figure 10A:
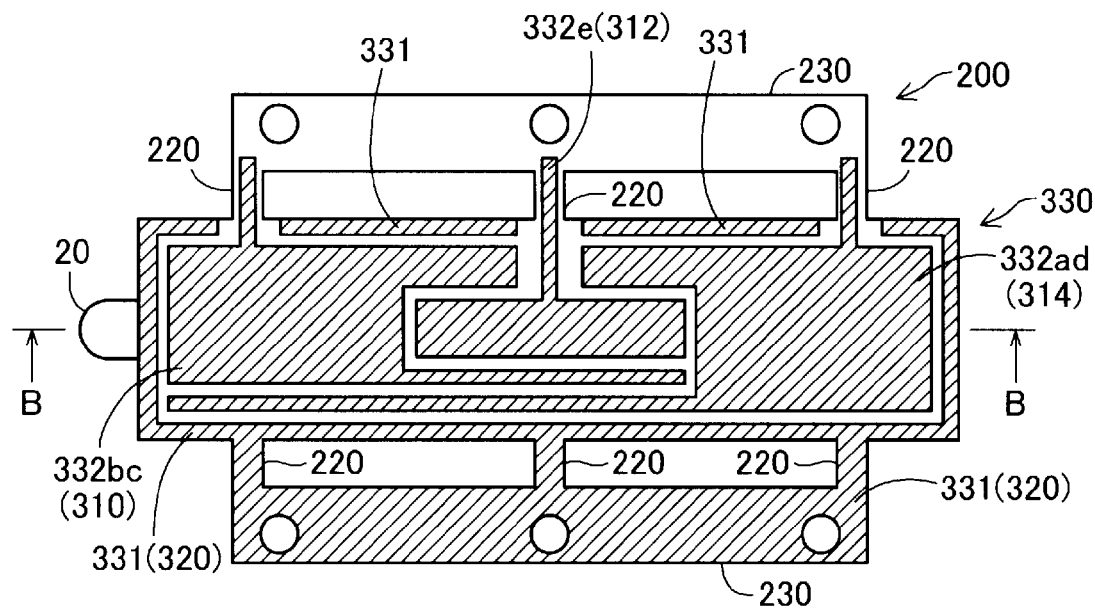
FIGS. 10A and 10B are plan views showing an example of a wiring pattern formed on a vibrating plate.
Figure 10B:
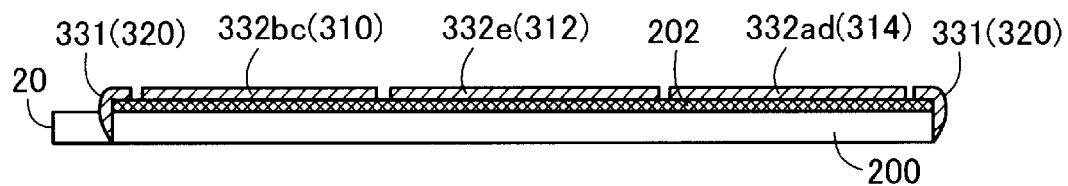

FIGS. 10A and 10B are explanatory diagrams showing an example of a wiring pattern 330 formed on the vibrating plate 200. The wiring pattern 330 includes a first wiring 331 which is connected to the first laminated conducting portion 271 shown in FIG. 9A, and second wirings 332*ad*, 332*bc*, and 332*e* which are connected to the second laminated conducting portions 272*ad*, 272*bc*, and 272*e*. The four kinds of the wirings 331, 332*ad*, 332*bc*, and 332*e* are connected to the four kinds of the laminated conducting portions 271, 272*ad*, 272*bc*, and 272*e* of FIG. 9A so that the surfaces thereof come into contact with each other. When the piezoelectric vibrating body 100 is bonded to the vibrating plate 200 (FIG. 8C), the wirings come in contact with the conducting pattern 270 of FIG. 9A in a horizontally inverted state of FIGS. 10A and 10B.

In general, when the plurality of piezoelectric elements 110 are divided into N sets (N is an integer equal to or larger than 2) of the piezoelectric element groups, N second conducting portions are preferably provided on the uppermost layer on the piezoelectric vibrating body 100 side so as to be insulated from each other, and meanwhile, the corresponding N second wirings are preferably provided on the wiring pattern 330 of the vibrating plate 200 so as to be insulated from each other. By doing so, the vibrating plate 200 and the piezoelectric vibrating body 100 are bonded to each other so that the surfaces thereof come into contact with each other, and accordingly, it is possible to easily perform wiring connection.

Among the wiring pattern 330 on the vibrating plate 200, the three second wirings 332*ad*, 332*bc*, and 332*e* for the three sets of the piezoelectric element groups PG1, PG2, and PG3 are extended to a position of the attachment portion 230 through the connection portion 220 which is on one side (upper side of FIG. 10A) of the vibrating plate 200. This is because the second wirings 332*ad*, 332*bc*, and 332*e* are connected to the driving circuit 300 (FIG. 3) at the position of the attachment portion 230. The first wiring 331 for the first electrode 130 is extended to a position of the attachment portion 230 through the connection portion 220 which is on the other side (lower side of FIG. 10A) of the vibrating plate 200. This is because the first wiring 331 is connected to the driving circuit 300 at the position of the attachment portion 230. These wirings 331, 332*ad*, 332*bc*, and 332*e* are respectively connected to the wirings 320, 314, 310, and 312 shown in FIG. 3. As described above, the wiring pattern 330 (331, 332*ad*, 332*bc*, and 332*e*) on the vibrating plate 200 is preferably formed to be extended to a surface part where the piezoelectric vibrating body 100 is not loaded. By doing so, it is possible to easily connect the electrodes 130 and 150 of the piezoelectric element 110 and the driving circuit 300.

As described above, the wirings 331, 332*ad*, 332*bc*, and 332*e* formed on the vibrating plate 200 are electrically connected to the laminated conducting portions 271, 272*ad*, 272*bc*, and 272*e* which are on the uppermost part of the piezoelectric vibrating body 100 so that the surfaces thereof come into contact with each other. Accordingly, it is possible to decrease a possibility of disconnection during an operation, compared to a case of performing the electrical connection using a lead wire and soldering. In addition, it is possible to implement space saving, compared to a case of using a lead wire. Since the wiring connection operation between the vibrating plate 200 and the piezoelectric vibrating body 100 is performed by only bonding the surfaces thereof to each other, it is possible to shorten the time for wiring and it is possible to prevent variation depending on an operator, because the operation is simple. Since the electrodes 130 and 150 of the piezoelectric element 110 are interposed between the piezoelectric element 110 and the vibrating plate 200 and the electrodes 130 and 150 are not exposed to the surface on the outer side, defects are decreased and durability is improved.

FIG. 10B shows a sectional view taken along line B-B of FIG. 10A. Among the wiring pattern 330 on the vibrating plate 200, the first wiring 331 for the first electrode 130 is extended to the side surface of the vibrating plate 200. In the embodiment, the vibrating plate 200 is formed of a conductive member such as a metal material. Accordingly, the first wiring 331 is electrically connected to the vibrating plate 200 on the side surface of the vibrating plate 200. As a result, it is possible to easily electrically connect the first electrode 130 of the piezoelectric element 110 and the vibrating plate 200. However, the first wiring 331 may be formed so as not to be extended to the side surface of the vibrating plate 200.

Figure 11A:
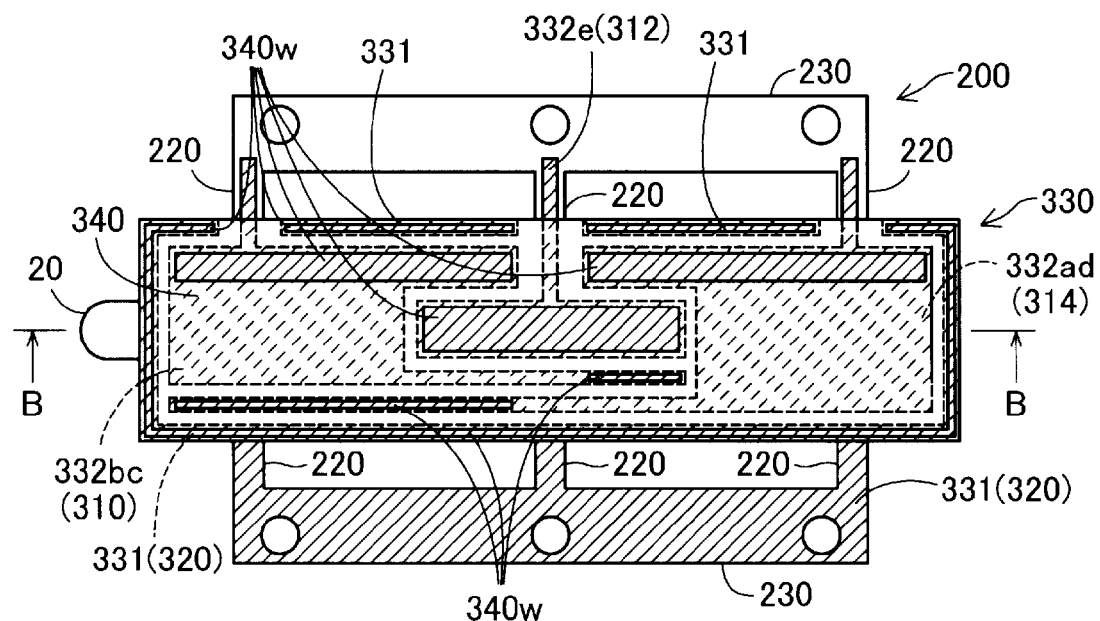
FIGS. 11A and 11B are plan views showing another example of the wiring pattern formed on the vibrating plate.
Figure 11B:
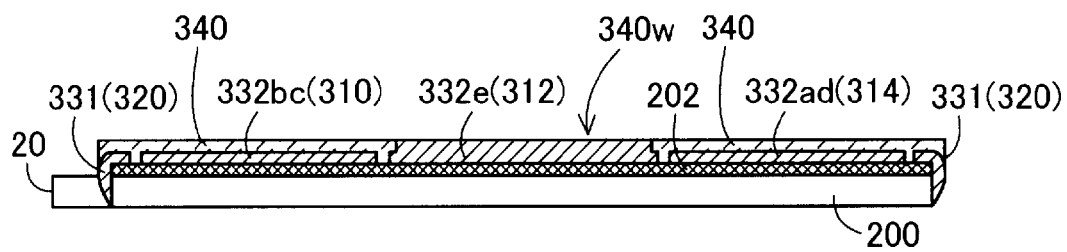

FIGS. 11A and 11B are explanatory diagrams showing another example of the wiring pattern 330 formed on the vibrating plate 200. Herein, an insulating layer 340 is further formed on the wiring pattern 330 of FIGS. 10A and 10B and openings 340w are provided on the plurality of parts of the insulating layer 340. As shown in FIG. 11B, some of the wirings 331, 332ad, 332bc, and 332e are exposed from the openings 340w. The parts of the wirings 331, 332ad, 332bc, and 332e exposed from the openings 340w function as pads, and are electrically connected to the laminated conducting portions 271, 272ad, 272bc, and 272e which are on the uppermost part of the piezoelectric vibrating body 100 so that the surfaces thereof come into contact with each other. As described above, the wiring pattern 330 may be covered with the insulating layer 340 and only the necessary wiring parts as pads may be exposed from the insulating layer 340. By doing so, a degree of freedom of the shape of the wiring pattern 330 increases, and accordingly, it is possible to more easily form the wiring pattern 330. Instead of allowing some of the wirings 331, 332ad, 332bc, and 332e to be exposed from the openings 340w of the insulating layer 340, the openings 340w may be filled with solder paste or solder grains. In this case, it is possible to implement the wiring connection by performing solder reflow after loading the piezoelectric vibrating body 100 on the vibrating plate 200.

Figure 12A:
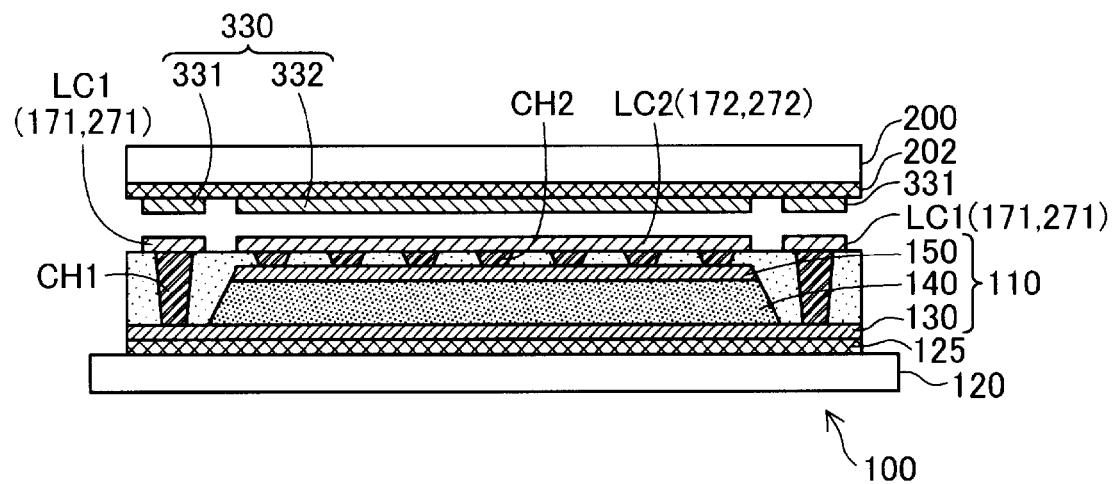
FIGS. 12A and 12B are schematic views of a laminated wiring structure of the piezoelectric driving device.
Figure 12B:
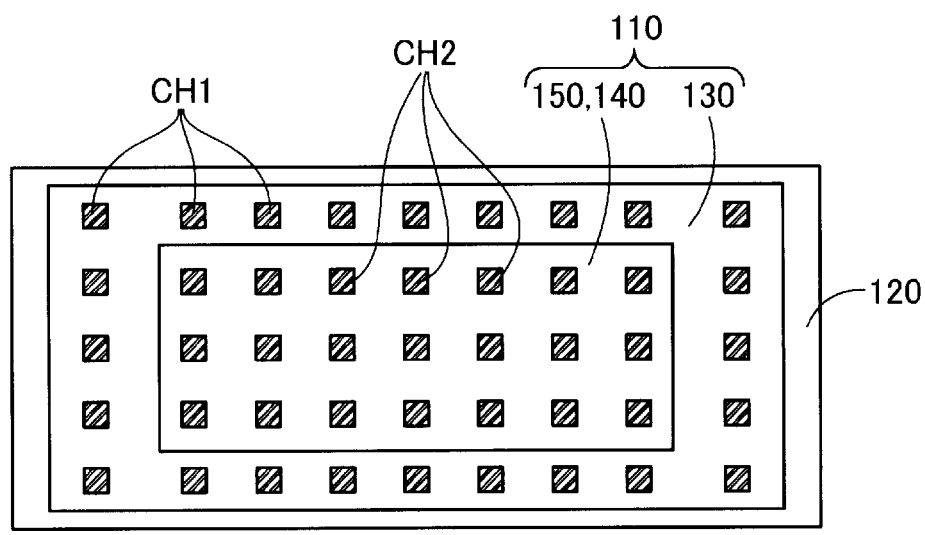

FIGS. 12A and 12B are schematic views of a laminated wiring structure of the piezoelectric driving device 10. Herein, the drawings also show a correspondence relationship with the laminated wiring structure described in FIGS. 8C to 10B. For convenience of description, FIGS. 12A and 12B show only one piezoelectric element 110 on the substrate 120 and FIG. 12A shows a state where the piezoelectric vibrating body 100 and the vibrating plate 200 are separated from each other. The insulating layer 202 is formed on the surface of the vibrating plate 200 and the wiring pattern 330 including the wirings 331 and 332 is formed on the insulating layer 202. The wiring 332 is a representative of the three second wirings 332ad, 332bc, and 332e shown in FIGS. 10A and 10B. The first electrode 130 of the piezoelectric element 110 is connected to a first laminated conducting portion LC1 through contact holes CH1. The first laminated conducting portion LC1 is a representative of the first laminated conducting portions 171 and 271 which are two layers shown in FIGS. 9A to 9E. The second wiring 150 of the piezoelectric element 110 is connected to a second laminated conducting portion LC2 through contact holes CH2. The second laminated conducting portion LC2 is a representative of the second laminated conducting portions 172 and 272 which are two layers shown in FIGS. 9A to 9E. The contact holes CH1 and CH2 are a representative of the contact holes 160c and 260c of the two insulating layers 160 and 260 shown in FIGS. 9A to 9E.

FIG. 12B shows a plan view of FIG. 12A. The plurality of contact holes CH1 for the first electrode 130 are evenly formed along the entire circumference of the first electrode 130. The plurality of contact holes CH2 for the second electrode 150 are evenly formed over the entire area of the second electrode 150. As shown in the schematic view, when the plurality of contact holes CH1 and CH2 are formed, there are effects that parasitic resistance is decreased and a voltage applied to both ends of the piezoelectric element 110 is not excessively decreased, as will be described below.

Figure 13:
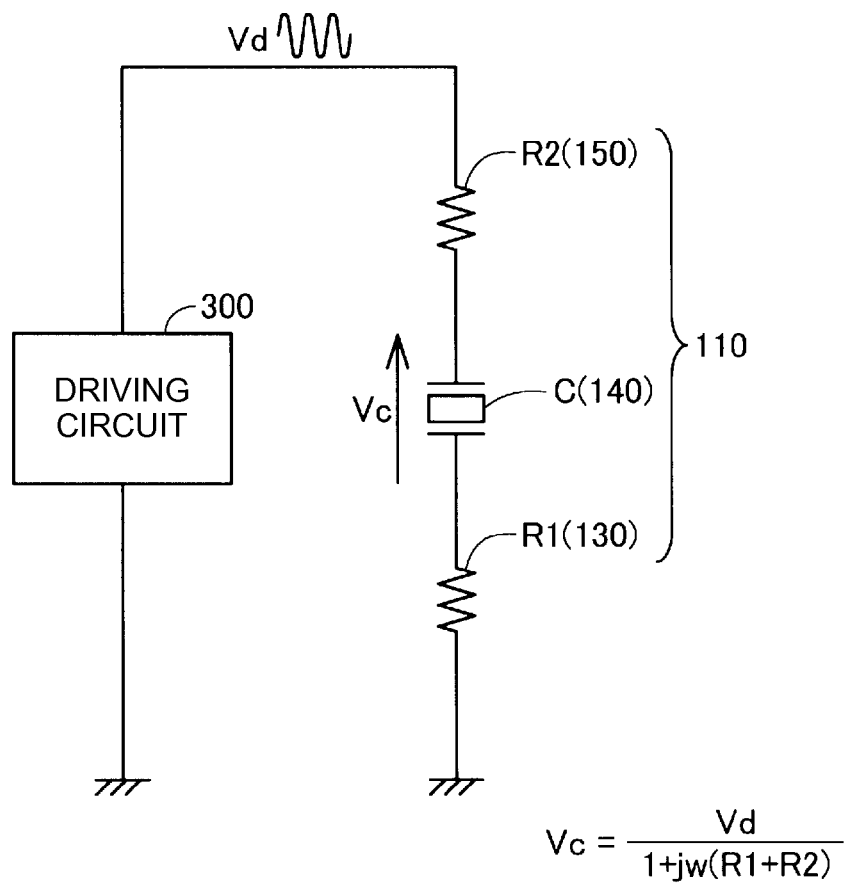
FIG. 13 is a circuit diagram showing the piezoelectric element and an equivalent circuit such as a driving circuit.

FIG. 13 is a circuit diagram showing the piezoelectric element 110 and an equivalent circuit such as the driving circuit 300. The piezoelectric element 110 is equivalent to a series connection of a parasitic resistor R1 of the first electrode 130, a capacitance C of the piezoelectric body 140, and a parasitic resistor R2 of the second electrode 150. An AC voltage or an undulating voltage is supplied from the driving circuit 300 to the piezoelectric element 110 as a driving voltage Vd. At that time, a voltage Vc applied to the piezoelectric element 110 is $Vd/\{1+j\omega(R1+R2)\}$. As shown in FIGS. 12A and 12B, when the electrodes 130 and 150 are connected to the laminated conducting portions LC1 and LC2 using the plurality of contact holes CH1 and CH2, it is possible to decrease the parasitic resistor R1 of the first electrode 130 or the parasitic resistor R2 of the second electrode 150, and accordingly, it is possible to increase the voltage Vc applied to the piezoelectric element 110 and to more efficiently drive the piezoelectric element 110. A large area of the contact holes CH1 and CH2 is preferable, and meanwhile, it is preferable not to decrease an area of the piezoelectric element 110 for the contact holes CH1 and CH2. In order to satisfy these two requirements, in a plan view shown in FIG. 12B, the plurality of contact holes CH2 are formed over the entire area of the second electrode 150 and the plurality of contact holes CH1 are formed over the entire area corresponding to the outer circumference of the second electrode 150, regarding the first electrode 130. In order to implement this configuration, it is preferable to form a frame-shaped area including the entire outer circumference of the second electrode 150 and which is present on the outer side of the second electrode 150, as the shape of the first electrode 130.

Figure 14A:
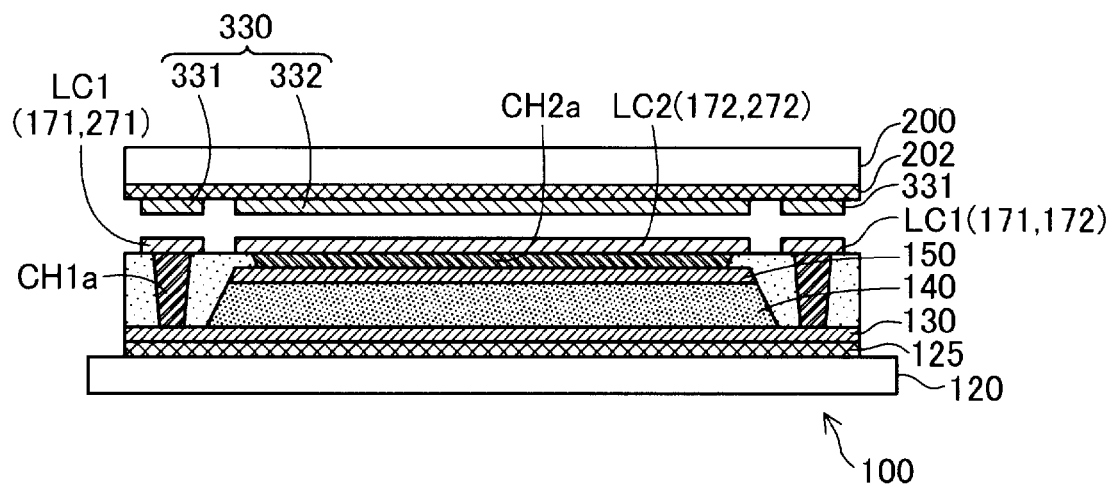
FIGS. 14A and 14B are schematic views showing another laminated wiring structure.
Figure 14B:
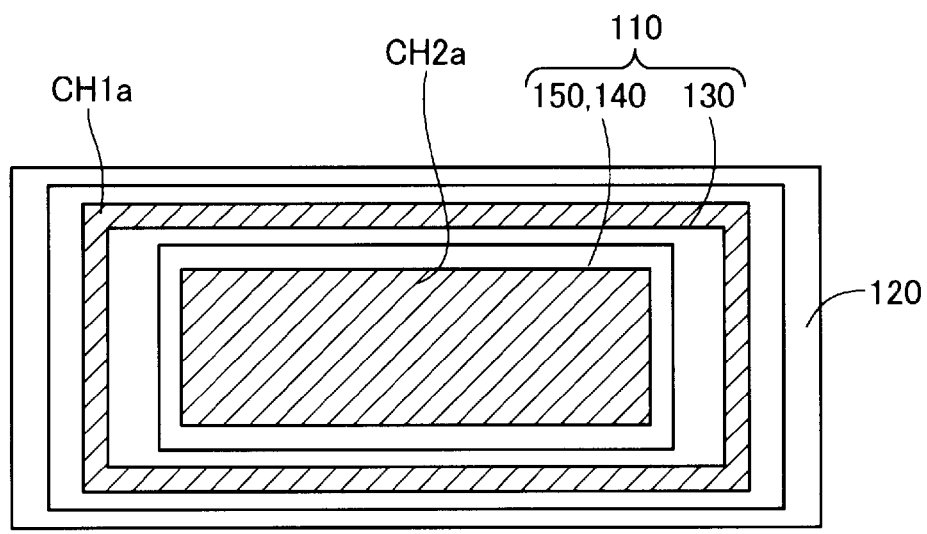

FIGS. 14A and 14B show a modification example of FIGS. 12A and 12B. Herein, one large contact hole CH1a is formed by connecting the plurality of contact holes CH1 for the first electrode shown in FIGS. 12A and 12B to each other. One large contact hole CH2a is also formed by connecting the plurality of contact holes CH2 for the second electrode in the same manner. Even with such a configuration, it is possible to obtain the same effects as in a case of the laminated wiring structure of FIGS. 12A and 12B.

As shown in the schematic views of FIGS. 12A and 12B and FIGS. 14A and 14B, the first laminated conducting portion LC1 and the second laminated conducting portion LC2 can be formed as at least a conducting pattern of one layer. However, as described in FIG. 8C and FIGS. 9A to 9E, the first laminated conducting portion LC1 and the second laminated conducting portion LC2 may be implemented using the conducting pattern of two or more layers (170 and 270 of FIGS. 9A to 9E). In this case, it is preferable that the first laminated conducting portion LC1 (171 and 271 of FIGS. 9A to 9E) and the second laminated conducting portion LC2 (172 and 272 of FIGS. 9A to 9E) are formed in the conducting pattern of each layer (170 and 270 of FIGS. 9A to 9E). When the conducting pattern of two or more layers is used, a degree of freedom of the wiring connection structure increases, compared to a case of using the conducting pattern of only one layer, and accordingly, it is possible to more easily configure the desired wiring connection structure. When the conducting pattern of two or more layers is provided, it is preferable to provide the insulating layer between the conducting pattern of the adjacent two layers.

As described above, according to the piezoelectric driving device 10 of the first embodiment, since the first wiring 331 and the second wiring 332 of the wiring pattern 330 of the vibrating plate 200 are connected to the first electrode 130 and the second electrode 150, it is possible to save space for the wirings and to decrease a possibility of disconnection, compared to a case where the wiring pattern 330 of the vibrating plate 200 is connected with the first electrode 130 and the second electrode 150 using a lead wire or soldering. Since the first wiring 331 and the second wiring 332 are connected to the first electrode 130 and the second electrode 150 through the first laminated conducting portion LC1 (171 and 271) and the second laminated conducting portion LC2 (172 and 272), an effect of decreasing space for wiring and an effect of decreasing a possibility of disconnection are significant. In addition, since the piezoelectric vibrating body 100 is installed on the vibrating plate 200 so that the piezoelectric element 110 is interposed between the substrate 120 and the vibrating plate 200, it is possible to prevent such undesired distortion by the substrate. As a result, it is possible to decrease a possibility of break-down or damaging of the piezoelectric driving device 10.

Other Embodiments of Piezoelectric Driving Device

Figure 15A:
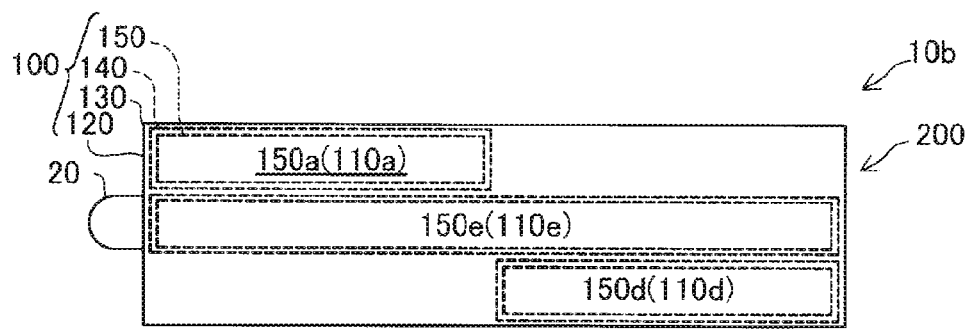
FIGS. 15A to 15C are plan views of a piezoelectric driving device of another embodiment.
Figure 15B:
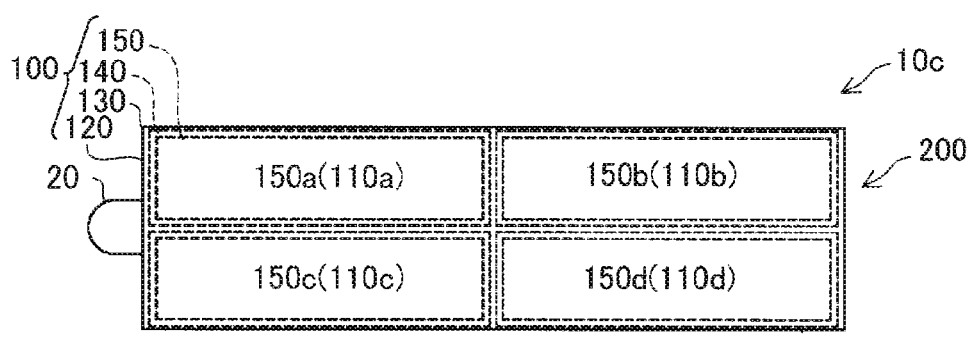
Figure 15C:
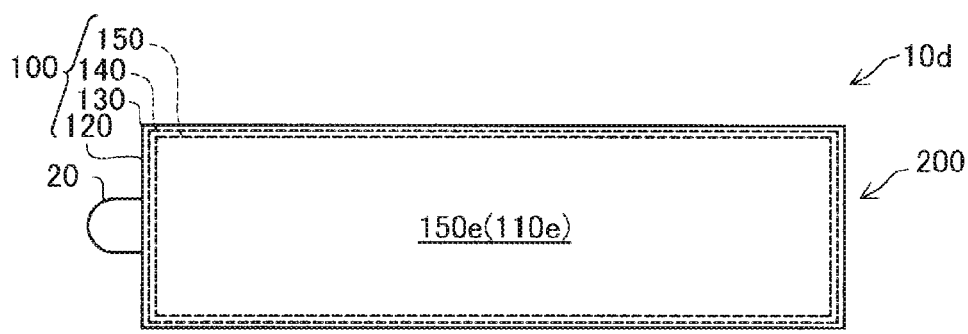

FIG. 15A is a plan view of a piezoelectric driving device 10b as another embodiment of the invention and is a diagram corresponding to FIG. 1A of the first embodiment. In FIGS. 15A to 15C, for convenience of description, the connection portion 220 or the attachment portion 230 of the vibrating plate 200 is omitted. In the piezoelectric driving device 10b of FIG. 15A, the pair of second electrodes 150b and 150c are omitted. This piezoelectric driving device 10b can also rotate the rotor 50 in one direction z as shown in FIG. 4A. Since the same voltage is applied to the three second electrodes 150a, 150e, and 150d of FIG. 15A, the three second electrodes 150a, 150e, and 150d may be formed as one continuous electrode layer.

FIG. 15B is a plan view of a piezoelectric driving device 10c as still another embodiment of the invention. In the piezoelectric driving device 10c, the second electrode 150e in the center of FIG. 1A is omitted, and the other four second electrodes 150a, 150b, 150c, and 150d are formed in a larger area than that of FIG. 1A. The piezoelectric driving device 10c can also implement substantially the same effects as those of the first embodiment.

FIG. 15C is a plan view of a piezoelectric driving device 10d as still another embodiment of the invention. In the piezoelectric driving device 10d, the four second electrodes 150a, 150b, 150c, and 150d of FIG. 1A are omitted and one second electrode 150e is formed with a large area. The piezoelectric driving device 10d is only expanded or contracted in the longitudinal direction, but it is possible to apply great force from the protrusion 20 to a body to be driven (not shown).

As shown in FIGS. 1A and 1B and FIGS. 15A to 15C, as the second electrode 150 of the piezoelectric vibrating body 100, at least one electrode layer can be provided. However, as shown in FIGS. 1A and 1B and FIGS. 15A to 15C, it is preferable to provide the second electrode 150 in a position diagonal to the rectangular piezoelectric vibrating body 100, because it is possible to deform the piezoelectric vibrating body 100 and the vibrating plate 200 in a meander shape to be curved in the plane thereof.

Embodiment of Apparatus Using Piezoelectric Driving Device

The piezoelectric driving device 10 described above can apply great force to a body to be driven by using resonance, and can be applied to various apparatuses. The piezoelectric driving device 10 can be used as a driving device in various apparatuses such as a robot (including an electronic component conveying apparatus (IC handler), a pump for medication, a calendar transporting apparatus of a clock, and a printing apparatus (for example, a paper feeding mechanism, however, a vibrating plate is not resonated in a piezoelectric driving device used in a head, and accordingly, the piezoelectric driving device is not applied to a head), for example. Hereinafter, a representative embodiment will be described.

Figure 16:
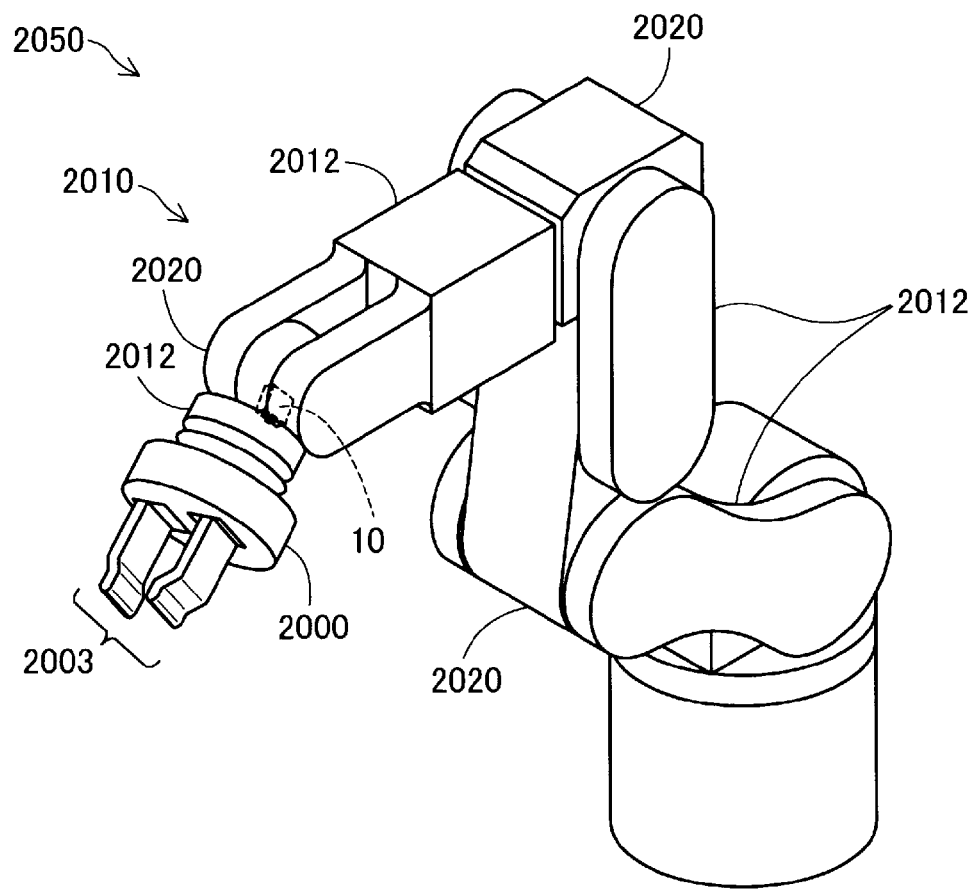
FIG. 16 is an explanatory diagram showing an example of a robot using the piezoelectric driving device.

FIG. 16 is an explanatory diagram showing an example of a robot 2050 using the piezoelectric driving device 10 described above. The robot 2050 includes an arm 2010 (also referred to as an "arm portion") which includes a plurality of linking portions 2012 (also referred to as "linking members") and a plurality of joints 2020 which are connected between the linking portions 2012 to be rotated or curved. The piezoelectric driving device 10 described above is embedded in each joint 2020, and it is possible to rotate or curve the joint 2020 by an arbitrary angle using the piezoelectric driving device 10. A robot hand 2000 is connected to an end of the arm 2010. The robot hand 2000 includes a pair of grasping portions 2003. The piezoelectric driving device 10 is also embedded in the robot hand 2000, and it is possible to open and close the grasping portions 2003 using the piezoelectric driving device 10 to grasp an object. In addition, the piezoelectric driving device 10 is also provided between the robot hand 2000 and the arm 2010, and it is possible to rotate the robot hand 2000 with respect to the arm 2010 using the piezoelectric driving device 10.

Figure 17:
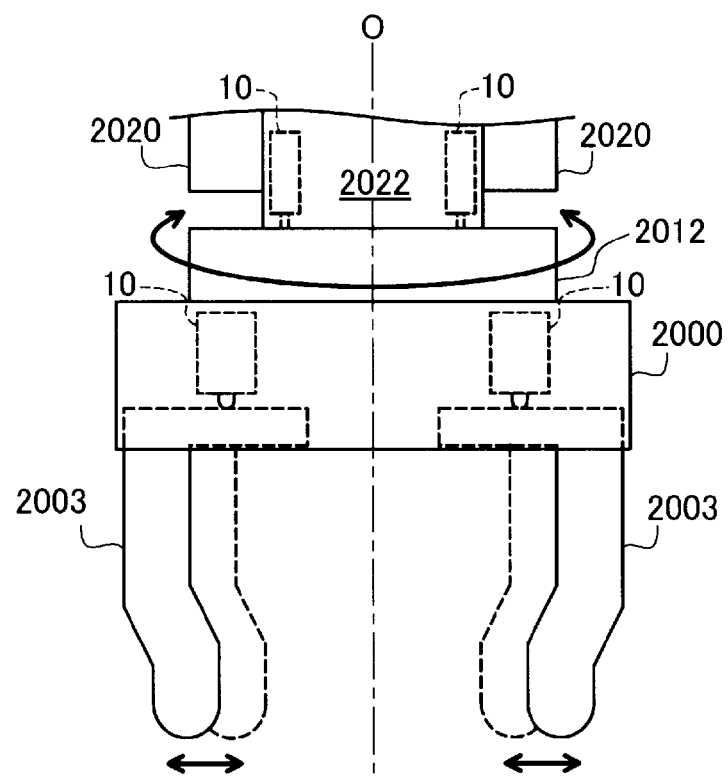
FIG. 17 is an explanatory diagram of a wrist part of a robot.

FIG. 17 is an explanatory diagram of a wrist part of the robot 2050 shown in FIG. 16. The wrist joints 2020 interpose a wrist rotation portion 2022 and a wrist linking portion 2012 is attached to the wrist rotation portion 2022 to be rotated around a center axis O of the wrist rotation portion 2022. The wrist rotation portion 2022 includes the piezoelectric driving device 10, and the piezoelectric driving device 10 rotates the wrist linking portion 2012 and the robot hand 2000 around the center axis O. The plurality of grasping portions 2003 are provided to stand on the robot hand 2000. A proximal end portion of the grasping portion 2003 can move in the robot hand 2000 and the piezoelectric driving device 10 is mounted in a base portion of this grasping portion 2003. Accordingly, by operating the piezoelectric driving device 10, it is possible to grasp a target by moving the grasping unit 2003.

The robot is not limited to a single arm robot, and the piezoelectric driving device 10 can also be applied to a multi-arm robot having two or more arms. Herein, in addition to the piezoelectric driving device 10, an electric power line for applying power to various devices such as a force sensor or a gyro sensor or a signal line for transmitting signals to the devices is included in the wrist joints 2020 or the robot hand 2000, and an extremely large number of wirings is necessary. Accordingly, it was extremely difficult to dispose wirings in the joints 2020 or the robot hand 2000. However, since the piezoelectric driving device 10 of the embodiment described above can decrease a driving current, compared to a general electric motor or a piezoelectric driving device of the related art, it is possible to dispose wirings even in a small space such as the joint 2020 (particularly, a joint on the edge of the arm 2010) or the robot hand 2000.

Figure 18:
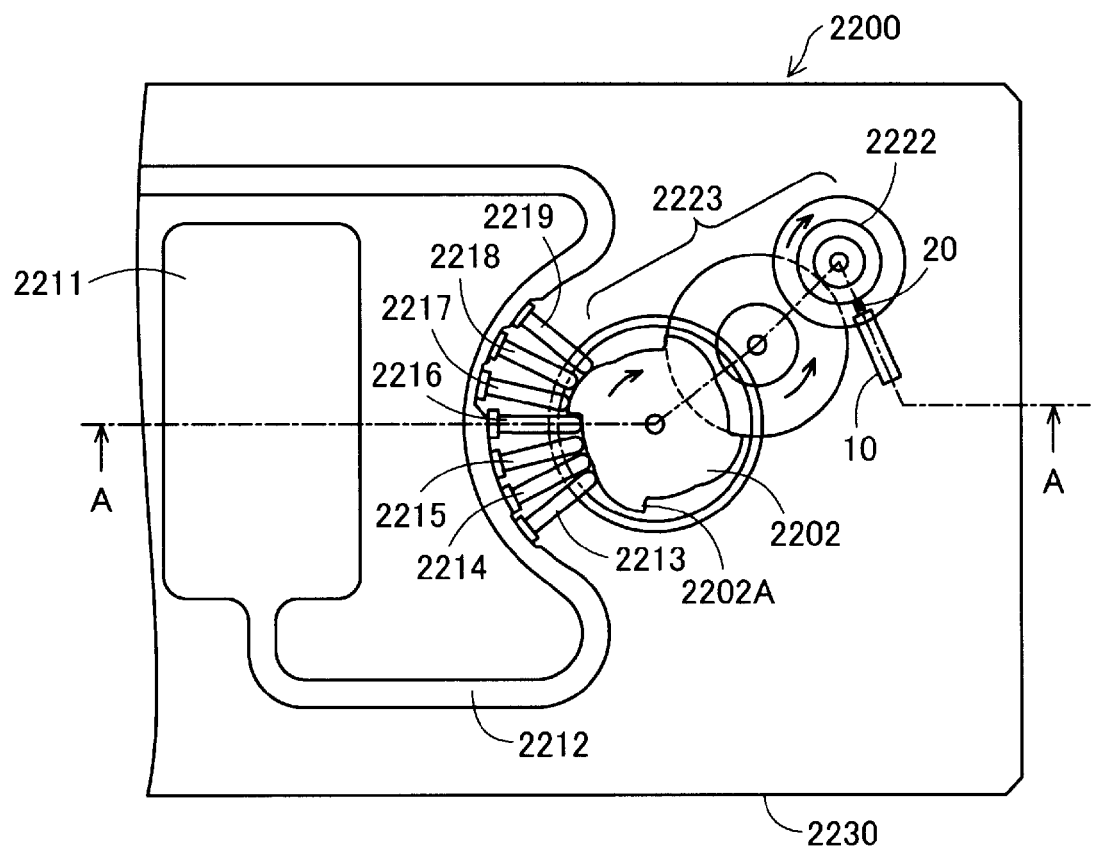
FIG. 18 is an explanatory diagram showing an example of a liquid feeding pump using the piezoelectric driving device.

FIG. 18 is an explanatory diagram showing an example of a liquid feeding pump 2200 using the piezoelectric driving device 10 described above. The liquid feeding pump 2200 includes a reservoir 2211, a tube 2212, the piezoelectric driving device 10, a rotor 2222, a deceleration transmission mechanism 2223, a cam 2202, and a plurality of fingers 2213, 2214, 2215, 2216, 2217, 2218, and 2219 in case 2230. The reservoir 2211 is an accommodation portion which accommodates liquid which is a transportation target. The tube 2212 is a tube which transports the liquid sent from the reservoir 2211. A protrusion 20 of the piezoelectric driving device 10 is provided in a state of being pressed against a side surface of the rotor 2222 and the piezoelectric driving device 10 rotates the rotor 2222. A rotation force of the rotor 2222 is transmitted to the cam 2202 through the deceleration transmission mechanism 2223. The fingers 2213 to 2219 are members which block the tube 2212. When the cam 2202 is rotated, the fingers 2213 to 2219 are pressed to the outer side in an emission direction in order, by a protrusion 2202A of the cam 2202. The fingers 2213 to 2219 block the tube 2212 in order from the upstream side in a transportation direction (reservoir 2211 side). Accordingly, the liquid in the tube 2212 is transmitted to the downstream side in order. By doing so, it is possible to accurately feed an extremely small amount of liquid and to implement a small liquid feeding pump 2200. The disposition of each member is not limited to that shown in the drawing. The members such as fingers or the like may not be provided and a ball or the like provided on the rotor 2222 may block the tube 2212. The liquid feeding pump 2200 described above can be used as a dosing apparatus which gives medication such as insulin to a human body. Herein, by using the piezoelectric driving device 10 of the embodiment described above, a driving current is decreased, compared to a case of the piezoelectric driving device of the related art, and accordingly, it is possible to decrease power consumption of the dosing apparatus. Accordingly, when the dosing apparatus is driven with a battery, the effects are particularly effective.

MODIFICATION EXAMPLES

The invention is not limited to the examples or embodiments described above and can be implemented in various forms within a range not departing from a gist thereof, and the following modifications can also be performed, for example.

Modification Example 1

In the embodiment, one piezoelectric vibrating body 100 is provided on both surfaces of the vibrating plate 200, but one of the piezoelectric vibrating bodies 100 can be omitted. However, it is preferable to provide the piezoelectric vibrating body 100 on both surfaces of the vibrating plate 200, because the vibrating plate 200 can be deformed in a meander shape to be curved in the plane thereof.

Modification Example 2

The sectional structure or the wiring connection structure described in the embodiment is merely an example and other sectional structures or wiring connection structures can be used. For example, regarding the kinds of the layer or the number of layers in the wiring connection structure, an arbitrary kind or number of the layers other than that of the embodiment described above can be suitably used. In the wiring pattern formed on the vibrating plate 200, it is not necessary to form both of the first wiring which is electrically connected to the first electrode 130 of the piezoelectric element 110 and the second wiring which is electrically connected to the second electrode 150, and only the wiring which is electrically connected to one of the first electrode 130 and the second electrode 150 may be formed. In this case, the other one of the first electrode 130 and the second electrode 150 can be connected to the driving circuit through an arbitrary electrically-connected wiring other than the wiring pattern formed on the vibrating plate 200.

Hereinabove, the embodiments of the invention have been described based on some examples, but the embodiments of the invention are for easy understanding of the invention and not for limiting the invention. The invention can include modifications, improvement, and equivalents to the invention, without departing from a gist and a scope of the aspects.

The entire disclosure of Japanese Patent Application No. 2014-164631, filed Aug. 13, 2014 is expressly incorporated by reference herein.

What is claimed is:

1. A piezoelectric driving device comprising:
   a substrate;
   a first electrode that is provided on the substrate;
   a piezoelectric member that is provided above the substrate;
   a second electrode that is provided on the piezoelectric member;
   a vibrating plate that is provided above the first and second electrodes, the vibrating plate having top and bottom surfaces opposite to each other, the bottom surface facing the first and second electrodes; and
   a wiring pattern that is provided on the bottom surface of the vibrating plate, the wiring patter being configured with a first wiring member and a second wiring member, the second wiring member being located at a first area of the bottom surface,
   wherein the first area correspond to the second electrode in a plan view,
   the first wiring member of the wiring pattern is electrically connected to the first electrode, and
   the second wiring member of the wiring pattern is electrically connected to the second electrode.

2. The piezoelectric driving device according to claim 1, wherein the first electrode and the first wiring member are electrically connected to each other through a first laminated conducting member, and
   the second electrode and the second wiring member are electrically connected to each other through a second laminated conducting member.

3. The piezoelectric driving device according to claim 2, further comprising:
   a conducting pattern that is configured by at least one layer, the conducting pattern being provided between the first electrode and the wiring pattern,
   wherein the first laminated conducting member and the second laminated conducting member configure the conducting pattern.

4. The piezoelectric driving device according to claim 3, wherein a farthest layer of the conducting pattern located at a position farthest from the substrate in a lamination direction is electrically connected to the wiring pattern so that a surface of the farthest layer of the conducting pattern and a surface of the wiring pattern are directly electrically contacted to each other.

5. The piezoelectric driving device according to claim 3, wherein an insulating layer is provided between a closest layer of the conducting pattern located at a position closest to the second electrode in a lamination direction and the second electrode, and the closest layer of the conducting pattern and the second electrode are electrically connected to each other through a plurality of contact holes provided in the insulating layer.

6. The piezoelectric driving device according to claim 3, wherein the conducting pattern is configured with a first conducting pattern, a second conducting pattern, and an insulating layer, and the insulating layer is provided between the first conducting pattern and the second conducting pattern, the first laminated conducting member in the first conducting pattern and the first laminated conducting member in the second conducting pattern are electrically connected to each other through a first plurality of contact holes provided in the insulating layer, and the second laminated conducting member in the first conducting pattern and the second laminated conducting member in the second conducting pattern are electrically connected to each other through a second plurality of contact holes provided in the insulating layer.

7. The piezoelectric driving device according to claim 1, wherein the substrate, the first electrode, the piezoelectric member and the second electrode configure a piezoelectric vibrating body, the vibrating plate includes a second area on which the piezoelectric vibrating body is not directly or indirectly provided, and the wiring pattern is formed on the second area of the vibrating plate.

8. The piezoelectric driving device according to claim 1, wherein the piezoelectric member has a thickness of 0.05 µm to 20 µm.

9. The piezoelectric driving device according to claim 1, wherein the vibrating plate is formed with a conductive member, and a part of the wiring pattern is formed over a side surface of the vibrating plate, and the wiring pattern is electrically connected to the vibrating plate.

10. The piezoelectric driving device according to claim 1, wherein the piezoelectric driving device includes a plurality of piezoelectric elements, each of the plurality of piezoelectric elements is configured with the first electrode, the piezoelectric member, and the second electrode, the plurality of piezoelectric elements are divided into N sets (N is an integer equal to or larger than 2) of piezoelectric element groups, when one or more piezoelectric elements driven at the same time are set as one set of the piezoelectric element group, the second electrodes of two or more piezoelectric elements are directly connected to each other through a connection wiring, when each set of the piezoelectric element groups includes two or more piezoelectric elements, and the N sets of the second wirings and the N sets of the second laminated conducting members are provided to be insulated from each other, and to correspond to each of the second electrodes of the N sets of piezoelectric element groups.

11. The piezoelectric driving device according to claim 1, further comprising:

a protrusion which is provided on the vibrating plate and comes in contact with a body to be driven.

12. A robot comprising:
a plurality of linking members;
joints connected to the plurality of linking members; and
the piezoelectric driving device according to claim 1 which is configured to rotate the plurality of linking members using the joints.

13. A robot comprising:
a plurality of linking members;
joints connected to the plurality of linking members; and
the piezoelectric driving device according to claim 9 which is configured to rotate the plurality of linking members using the joints.

14. A robot comprising:
a plurality of linking members;
joints connected to the plurality of linking members; and
the piezoelectric driving device according to claim 2 which is configured to rotate the plurality of linking members using the joints.

15. A robot comprising:
a plurality of linking members;
joints connected to the plurality of linking members; and
the piezoelectric driving device according to claim 3 which is configured to rotate the plurality of linking members using the joints.

16. A driving method of the robot according to claim 12, wherein a driving circuit of the piezoelectric driving device applies an AC voltage or a voltage obtained by applying an offset voltage to the AC voltage as a driving voltage between the first electrode and the second electrode so that the piezoelectric driving device is configured to rotate the plurality of linking members using the joints.

17. A driving method of the piezoelectric driving device according to claim 1, comprising:

applying an AC voltage or a voltage obtained by applying an offset voltage to the AC voltage as a driving voltage between the first electrode and the second electrode.

18. A driving method of the piezoelectric driving device according to claim 9, comprising:

applying an AC voltage or a voltage obtained by applying an offset voltage to the AC voltage as a driving voltage between the first electrode and the second electrode.

19. A driving method of the piezoelectric driving device according to claim 2, comprising:

applying an AC voltage or a voltage obtained by applying an offset voltage to the AC voltage as a driving voltage between the first electrode and the second electrode.

20. A driving method of the piezoelectric driving device according to claim 3, comprising:

applying an AC voltage or a voltage obtained by applying an offset voltage to the AC voltage as a driving voltage between the first electrode and the second electrode.

* * * * *